United States Patent [19]
Ujiie et al.

[11] Patent Number: 6,081,163
[45] Date of Patent: Jun. 27, 2000

[54] STANDARD FREQUENCY AND TIMING GENERATOR AND GENERATION METHOD THEREOF

[75] Inventors: Hitoshi Ujiie; Kazuyuki Maruo, both of Kamiayshi, Japan

[73] Assignee: Advantest Corp., Tokyo, Japan

[21] Appl. No.: 09/234,979

[22] Filed: Jan. 22, 1999

[51] Int. Cl.[7] .................. H03L 7/07; H03L 7/14
[52] U.S. Cl. .................. 331/2; 331/3; 331/11; 331/14; 331/16; 331/17; 331/25
[58] Field of Search .................. 331/2, 3, 10, 11, 331/14, 16, 17, 25

[56] References Cited

U.S. PATENT DOCUMENTS

| | | | |
|---|---|---|---|
| 5,629,649 | 5/1997 | Ujiie | 331/17 |
| 5,870,001 | 2/1999 | Osterling et al. | 331/12 |
| 5,940,027 | 8/1999 | Forseth et al. | 331/18 |

Primary Examiner—Siegfried H. Grimm
Attorney, Agent, or Firm—Muramatsu & Associates

[57] ABSTRACT

A frequency standard generator includes a voltage controlled crystal oscillator (VCXO) for generating high stability output signal, a radio wave receiver to receive a radio wave which includes a high accuracy reference time signal, a time interval measuring circuit which measures a phase difference between the reference time signal and the output signal of the VCXO; a frequency control processor which determines control data based on the phase difference data to phase lock the output signal of the VCXO to the reference time signal, a frequency deviation data generator for compiling the phase difference data to obtain frequency deviation trend data of the VCXO, and a compensation data generator for generating compensation data based on the frequency deviation trend data to compensate frequency changes in said VCXO when the reference time signal is unavailable.

46 Claims, 21 Drawing Sheets

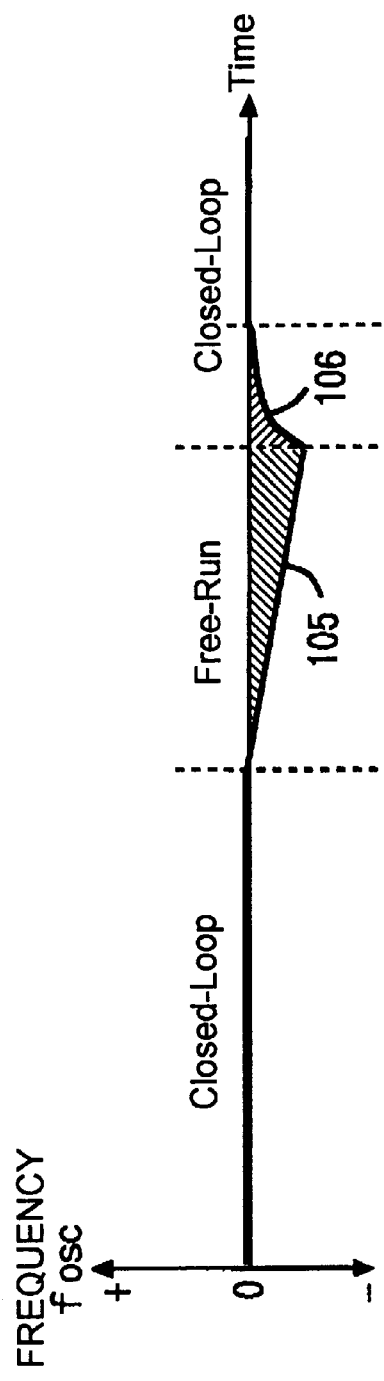
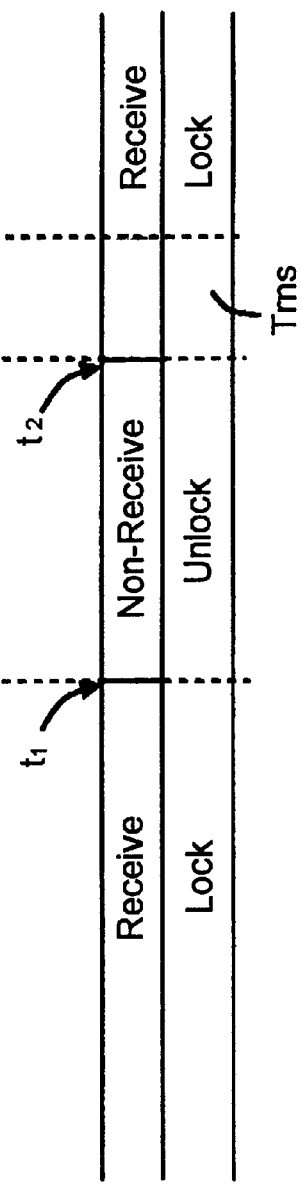
(Prior Art)
Fig. 6A
Fig. 6B
Fig. 6C

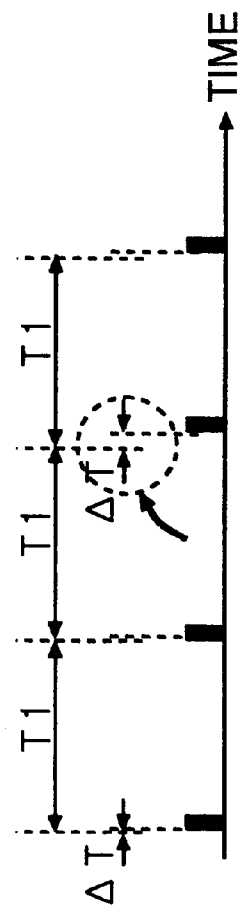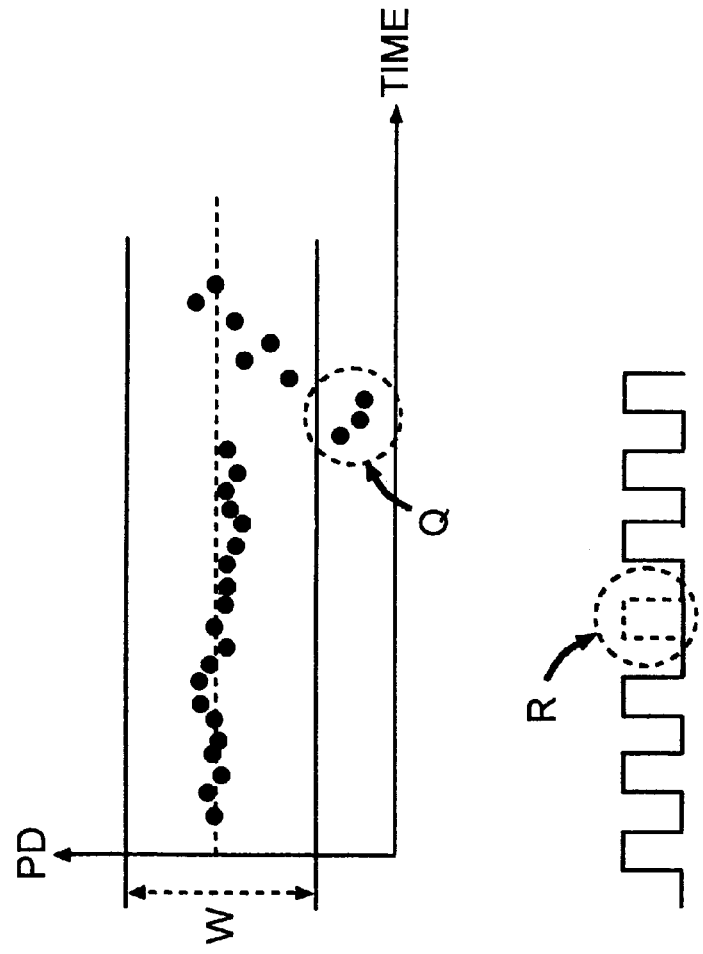
FIG.15A
FIG.15B
FIG.15C

FIG.16

| | | Sample 1 | Sample 2 | Sample 3 | Sample 4 | Sample 5 |
|---|---|---|---|---|---|---|
| Reliability of Each Block (Prior Art) | GPS-RX | 0.7 | 0.7 | 0.8 | 0.6 | 0.5 |
| | DP-PLL | 0.7 | 0.7 | 0.8 | 0.6 | 0.5 |
| | OUTPUT | 0.7 | 0.7 | 0.8 | 0.6 | 0.5 |
| | SW | 0.9 | 0.99 | 0.99 | 0.9 | 0.99 |
| A×B×C×S  R1 | | 0.3087 | 0.3396 | 0.5069 | 0.1944 | 0.1238 |
| A×B×C×S  R2 | | 0.3087 | 0.3396 | 0.5069 | 0.1944 | 0.1238 |
| Reliability R3 | | 0.5221 | 0.5638 | 0.7568 | 0.3510 | 0.2322 |
| A | | | | | | |
| Reliability of Each Block | GPS-RX | 0.7 | 0.7 | 0.8 | 0.6 | 0.5 |
| | DP-PLL | 0.7 | 0.7 | 0.8 | 0.6 | 0.5 |
| | OUTPUT | 0.7 | 0.7 | 0.8 | 0.6 | 0.5 |
| | SW | 0.9 | 0.99 | 0.99 | 0.9 | 0.99 |
| {1−(1−A)×(1−A)}  NR1 | | 0.91 | 0.91 | 0.96 | 0.84 | 0.75 |
| Sa×B  NR21 | | 0.63 | 0.693 | 0.792 | 0.54 | 0.495 |
| Sa×B  NR22 | | 0.63 | 0.693 | 0.792 | 0.54 | 0.495 |
| [1−{1−(Sa×B)}×{1−(Sa×B)}]  NR2 | | 0.8631 | 0.9058 | 0.9567 | 0.7884 | 0.7450 |
| Sb×C×Sc  NR31 | | 0.567 | 0.6861 | 0.7841 | 0.486 | 0.490 |
| Sb×C×Sc  NR32 | | 0.567 | 0.6861 | 0.7841 | 0.486 | 0.490 |
| [1−{1−(Sb×C×Sc)} × {1−(Sc×C×Sc)}]  NR3 | | 0.8125 | 0.9014 | 0.9534 | 0.7358 | 0.740 |
| B Reliability NR4 | | 0.6382 | 0.743 | 0.8757 | 0.4873 | 0.4134 |
| C Improvement (%) | | 11.6 | 17.9 | 11.9 | 13.6 | 18.1 |

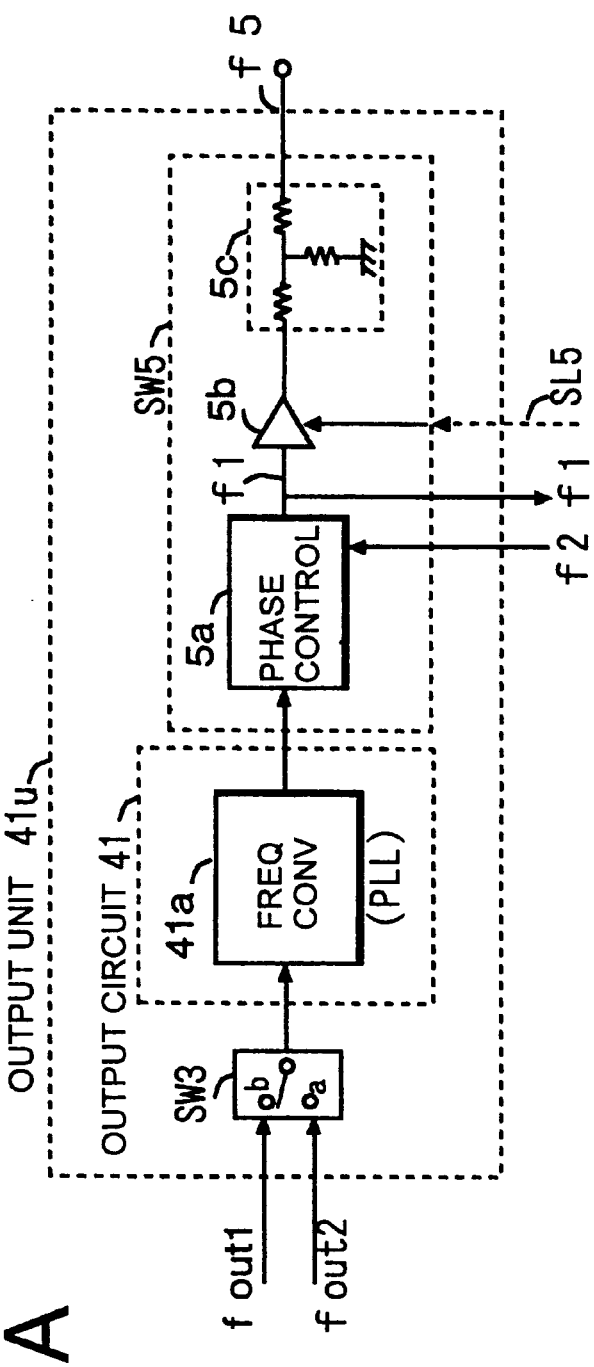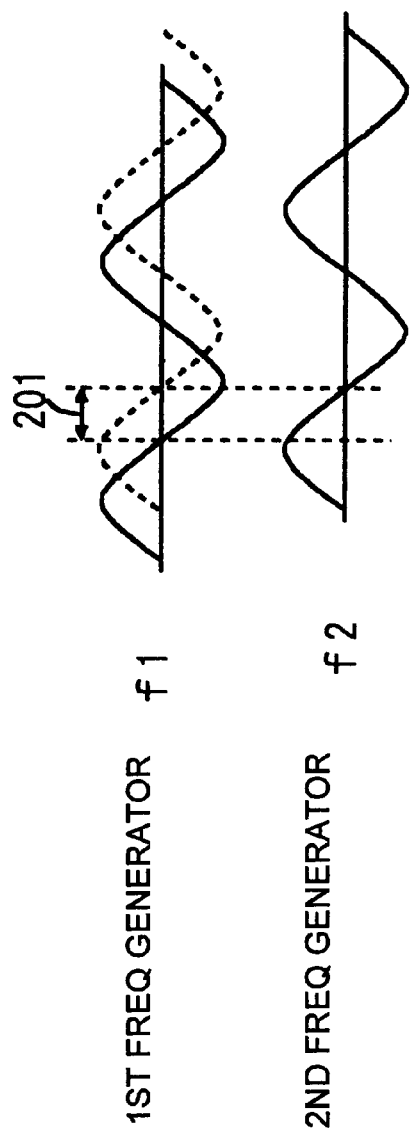
FIG. 19A
FIG. 19B

STANDARD FREQUENCY AND TIMING GENERATOR AND GENERATION METHOD THEREOF

FIELD OF THE INVENTION

This invention relates to a standard frequency and timing generator for generating high precision reference frequencies and timings by receiving an ultra-high accuracy atomic reference signal or equivalent thereof from an external source and synchronizing an internal clock generator with the received reference signal. More particularly, this invention relates to a standard frequency and timing generator and a method thereof for maintaining the accuracy of the output frequency and timing when the ultra-high accuracy reference signal is not available for a certain period of time. Further, this invention relates to a standard frequency and timing generator of a parallel system for improving overall reliability thereof.

BACKGROUND OF THE INVENTION

Recent communication systems, for example, a mobile communication system, requires a higher resolution and accuracy clock signal uniformly used in communication networks and systems. In particular, a digital communication network, data communication networks including mobile communication networks and TV broadcasting networks, and an environmental observation network of global scale, require high resolution, high accuracy and high stability clock signals.

An example of conventional frequency standard generator to be used for such purposes is shown in the U.S. Pat. No. 5,629,649 issued to Ujiie which is briefly shown in FIG. 5. In this conventional example, the frequency standard generator has a voltage controlled quartz-crystal oscillator which is phase locked to a GPS (Global Positioning System) satellite time signal. As is known in the art, an atomic-resonance frequency standard is available as UTC (Coordinated Universal Time) based on the international agreement. The GPS time signal is originated from the UTC time signal and is included in the satellite radio wave.

The standard frequency generator receives the radio waves from the GPS satellite to reproduce a high accuracy GPS time signal in the radio waves. The frequency standard generator of FIG. 5 synchronizes the oscillation frequency of a crystal oscillator with the GPS time signal. Such synchronization is carried out by a phase lock loop on the basis of average phase data indicating a phase difference of a long time period between the GPS time signal and a time period of the output of the crystal oscillator.

The conventional frequency standard generator of FIG. 5 includes a voltage controlled crystal oscillator (VCXO) 10, a temperature sensor 29 attached to the crystal oscillator 10, a satellite wave receiver 11, a time interval measuring circuit 12, a frequency control processor 13, a D/A (digital to analog) converter 14, a frequency divider 15, a signal adder 50 and frequency converters 16 and 17. An output frequency $f_{out}$ of the frequency standard generator is used as a standard frequency signal.

The frequency standard generator of FIG. 5 forms a phase lock loop wherein the output frequency of the voltage controlled crystal oscillator (VCXO) 10 is phase locked to the GPS time signal from the GPS satellite. To accomplish the phase lock operation, the output frequency of the VCXO 10 is feedbacked to be compared with the GPS time signal. A resultant comparison signal forms a control signal to control the phase of the crystal oscillator output to be equal to the GPS satellite time signal. Thus, a negative feedback loop is created to form the phase lock loop (PLL) noted above as described in more detail below.

More specifically, the voltage controlled crystal oscillator (VCXO) 10 of FIG. 5 includes a quartz-crystal oscillator which has, for example, frequency stability of $5 \times 10^{-10}$/day and a variable frequency range ($\Delta f/f$) of $2 \times 10^{-7}$ which is controlled by a control voltage supplied thereto. The quartz-crystal oscillator is preferably provided in a constant temperature oven. The temperature of the oven is monitored by the temperature sensor 29 to feedback control the temperature of the voltage controlled crystal oscillator 10, thereby minimizing the frequency change caused by the temperature change.

The satellite wave receiver 11 receives the radio wave from the GPS (Global Positioning System) satellite and reproduces a GPS time signal in the radio wave. Typically, the GPS time signal from the GPS satellite is a 1 pps (one pulse per second) signal which is modulated by a carrier signal of the radio wave. The GPS time signal in the radio wave is produced by an atomic frequency standard such as a cesium or rubidium frequency standard and has a very high frequency accuracy and stability.

The time interval measuring circuit 12 measures the time interval of the GPS satellite time signal $GPS_{1pps}$ (which may also be referred to as "$UTC_{1pps}$") from the satellite wave receiver 11 and a crystal time signal $VCXO_{1pps}$ from the VCXO 10 through the divider 15 to compare the phase difference between the two. Namely, the time interval measuring circuit 12 functions as a phase comparator for the phase lock loop. Preferably, the time interval measuring circuit 12 measures the time interval (phase difference) with higher resolution than the smallest time period of a clock signal used in the circuit by incorporating an interpolation technique (not shown) as is well known in the art.

The frequency control processor 13 receives phase comparison (difference) data from the time interval measuring circuit 12 and produces a phase (frequency) control signal representing the phase difference. The frequency control processor 13 also produces various phase lock parameters which determines a response characteristics of the phase lock loop such as a loop gain and a loop bandwidth. The frequency control processor 13 dynamically determines the frequency control signal and the phase lock parameters based on the phase difference between the satellite time signal $GPS_{1pps}$ and the crystal time signal $VCXO_{1pps}$.

The D/A converter 14 receives the frequency control signal from the frequency control processor 13 and converts the frequency control signal to an analog voltage which is supplied to the VCXO 10. The output of the crystal oscillator 10 is feedbacked to the time interval measuring circuit 12 through the frequency divider 15. The dividing ratio of the divider 15 is determined so as to produce a 1 pps (one pulse per second) rate out of the oscillation frequency of the VCXO 10 to be supplied to the time interval measuring circuit 12.

In this example, the output of the crystal oscillator 10 is also used as a clock signal for the time interval measuring circuit 12 through the frequency converter 16. The frequency converter 16 is typically a frequency multiplier to form a clock signal whose frequency is high enough to obtain a required level of resolution in measuring the time interval by the time interval measuring circuit 12.

In the frequency control processor 13, a frequency control algorithm is so established that the phase lock loop is not influenced by short term noise or interference signals accidentally or intentionally applied to the satellite radio wave. Such noise or interference signals may last for several hundred seconds. Thus, the frequency control algorithm by the frequency control processor 13 includes a digital filter having a time constant of very long time such as one thousand seconds so that the phase lock loop response is not affected by the interference signals.

In this conventional technology, if, for some reasons, the ultra-high accuracy GPS time signal is not available for a short period of time, the accuracy of the standard frequency generator is maintained because of the time constant of the phase lock loop. However, if such a time period of unavailability of the GPS time signal is long, the output frequency accuracy will be gradually deteriorated because the phase lock loop is no longer effective. The output frequency reflects the aging rate (frequency stability) of the voltage controlled crystal oscillator (VCXO) 10, resulting in problems in the communication system.

FIGS. 6A–6C illustrate problems arising in such a situation. Generally, a voltage controlled crystal oscillator (VCXO) 10 exhibits frequency changes in the passage of time. The graphs of FIGS. 6A–6C show variations in the oscillation frequency of the VCXO 10 under the constant temperature atmosphere when the unavailability of the GPS time signal continues for a long period of time.

Until time t1, the standard frequency generator is provided with the GPS time signal (FIG. 6B) so that the VCXO 10 is under the control of the closed loop (phase lock loop PLL) as in FIG. 6C. Thus, during this period (lock-in state of PLL), the oscillation frequency of the VCXO 10 is in the accuracy of the GPS time signal as shown in FIG. 6A.

However, when the GPS time signal is unable to be received by the satellite wave receiver in the standard frequency generator, a negative feedback is not established in the phase lock loop. Accordingly, during the time period defined by the times t1 and t2 in FIG. 6B, the VCXO 10 must be in a free-running state (unlock state of PLL) as in FIG. 6C. Since the oscillation frequency of the VCXO 10 changes with the elapse of time, the frequency will be deviated from the ideal frequency (frequency phase locked to the GPS time signal) as shown by a curve 105 of FIG. 6A.

When the GPS time signal is recovered at the time t2 of FIG. 6B, the phase lock loop establishes a lock-in state again at a time t3 after a transition time $T_{ms}$ as in FIGS. 6B and 6C. During the transition time $T_{ms}$, the frequency deviation in the oscillation frequency of the VCXO 10 is returned to the minimum level by a curve 106 of FIG. 6A. Generally, the frequency deviation shown by the curve 105 increases with the increase of the time length during which the GPS reference signal is not available.

Thus, there arises a problem when the GPS time signal is not available for a log period of time, because as a result of which, the frequency deviation of the VCXO 10 exceeds an allowable range of a communication system using the standard frequency. If the frequency deviation is outside the acceptable range, such a communication system must cease its operation.

Smaller rates of frequency changes in the free running state of a voltage controlled crystal oscillator are available in the market. However, such higher stability crystal oscillators are expensive which increases cost in creating communication systems. Since telephone systems, mobile communication systems in particular, need severe cost reduction, such an expensive crystal oscillator is inadequate in these applications.

Thus, there is a need in a communication system, such as in a base station of a mobile telephone system, to maintain the standard frequency of the system within a specified level of accuracy even when the GPS time signal is unavailable.

Another conventional technology in the standard frequency generator is described in the following. This example concerns a parallel system to attain high system reliability. Once a communication system is in service, the system must be continuously operable for a very long time such as ten years or more. To continuously generate a standard frequency signal with high accuracy for many years, it is a common practice to have two or more standard frequency generators in the communication system. When there is a problem in one standard generator, such a standard generator will be immediately replaced with another standard generator to maintain the system operation.

An example of parallel systems in the conventional technology is shown in FIG. 18. The parallel standard frequency generator system of FIG. 18 is formed of an antenna, a power divider 8, a first frequency generator and a second frequency generator. The first frequency generator includes a satellite wave receiver 511, a standard frequency generator 21, a microprocessor 531, an output circuit 41 and an output switch SW5. The second frequency generator includes a satellite wave receiver 512, a standard frequency generator 22, a microprocessor 532, an output circuit 42 and an output switch SW6. Each of the standard frequency generators 21 and 22 is configured in the same manner as shown in FIG. 5.

The power divider 18 provides a satellite radio signal from the antenna to the first and second frequency generators. As noted above, an artificial satellite, such as a GPS (Global Positioning System) satellite radiates an ultra-high accuracy clock signal. Such a clock signal is called a GPS time signal or a UTC (Coordinated Universal Time) signal. The GPS time signal is detected by the satellite wave receivers 511 and 522 which are respectively used as reference signals to phase lock loops for controlling the oscillation frequency of the standard frequency generators 21 and 22 by the phase lock loop operation.

Such a GPS time signal is purposefully provided with short term noise or disturbances because of the military reason. Further, the GPS time signal is a slow repetition rate time signal of one second (one pulse per second). Thus, the time constant in the PLL loop is set to be very long with use of a digital filter technology to effectively remove the noise or short term variations. The output circuits 41 and 42 correspond to frequency converters 17 such as shown in FIG. 5.

Each of the microprocessors 531 and 532 functions as a digital signal processor in the phase lock operation as well as a controller for monitoring and controlling the overall operation of the parallel system. A communication line 535 is provided to exchange information between the microprocessors 531 and 532 regarding, for example, in the allocation of operations of the frequency generators. Although two microprocessors are shown, it is also possible to perform the same function by only one microprocessor.

Thus, the two frequency generators can operate for generating the same standard frequency signal based on the same reference signal from the satellite. In a normal situation, an output of one of the frequency generators, such as from the first generator is selected by the output switch SW5 and used by a communication system (not shown). However, when there arises a problem in the operation of the first frequency generator, the output frequency of the second frequency generator is supplied to the communication system by switching "on" the output switch SW6 and switching "off" the output switch SW5.

The example of FIG. 18 is also capable of generating a standard timing signal such as $UTC_{1pps}$ produced by reference timing generators 545 and 546. This timing signal UTC is basically the same as that received from the satellite but has less noise because of the large time constant filter used in the PLL circuit. The standard timing signal is produced from the standard frequency signals generated by the standard frequency generators 21 and 22.

In the foregoing arrangement of the conventional parallel system, any defect in any components or blocks in the frequency generator now in use requires replacement of the whole frequency generator with another frequency generator. Such a switching over is automatically and instantaneously performed under the control of the microprocessors. As a consequence, standard frequency generator with high reliability can be achieved.

However, the standard frequency $f_{out1}$ in the standard frequency generator 21, and the standard frequency $f_{out2}$ in the standard frequency generator 22 are not exactly the same in the frequency. Namely, there is a very small difference in the frequency between the two signals even though they are produced by the same GPS time signal. Thus, when the output of the frequency generator is switched, the standard frequency supplied to the communication system slightly changes, which affects the operation of the communication system. Further, there also exists a difference in the phase between the two output signals of the first and second frequency generators. Moreover, the output switches SW5 and SW6 do not necessarily change the states at exactly the same timing. Therefore, when replacing one frequency generator with the other, the frequency and phase are disturbed even in a short period of time, which affects the operational quality of the communication system.

As noted above, the parallel system in the conventional technology of FIG. 18 is able to achieve an operation of high reliability by switching between the two same frequency generators. However, detection of any failures in only one of the blocks in the frequency generator now in use requires the replacement of the whole frequency generator with another frequency generator. In other words, even though other components or blocks in the frequency generator are appropriate, a defect found in only one block makes the whole frequency generator useless. Thus, it is difficult to further improve overall reliability of the parallel system. Further, as noted above, the conventional technology of FIG. 18 involves frequency fluctuations or phase changes, i.e., waveform distortions, when the output signal is changed from the one to the other.

SUMMARY OF THE INVENTION

Therefore, it is an object of the present invention to provide a frequency standard and timing generator which is capable of maintaining the accuracy of the frequency and timing generated therefrom within a specified range even when an external ultra high accuracy reference signal is unavailable for a long period of time.

It is another object of the present invention to provide a frequency standard and timing generator which is capable of maintaining the high accuracy of the frequency and timing generated therefrom without using a high stability crystal oscillator when an external reference signal is unavailable for a long period of time.

It is a further object of the present invention to provide a frequency standard and timing generator which is capable of maintaining the high accuracy of the frequency and timing generated therefrom when an external reference signal is unavailable by supplying compensation data derived from analyzing the past trend of frequency deviation in the crystal oscillator used therein.

It is a further object of the present invention to provide a frequency standard and timing generator which is capable of maintaining the high accuracy of the frequency and timing generated therefrom when an external reference signal is unavailable by utilizing compensation data produced by analyzing the past trend of frequency deviation in the crystal oscillator used therein and anticipating the future trend thereof.

It is a further object of the present invention to provide a frequency standard and timing generator which is capable of maintaining the high accuracy of the frequency and timing generated therefrom when an external reference signal is unavailable by utilizing compensation data produced by a mathematical process applied to the past trend of frequency deviation in the crystal oscillator used therein.

It is a further object of the present invention to provide a frequency standard and timing generator which is capable of maintaining the high accuracy of the frequency and timing generated therefrom when an external reference signal is unavailable by utilizing compensation data produced by a Wavelet transform process applied to the past trend of frequency deviation in the crystal oscillator used therein.

It is a further object of the present invention to provide a frequency standard generator of a parallel system which is capable of improving an overall reliability by replacing a defective block in one generator with the corresponding block in the other generator.

It is a further object of the present invention to provide a frequency standard generator of a parallel system which is capable of switching from one function unit to a counterpart function unit when any defects are found in the function unit without affecting other performances of the standard frequency generator.

It is a further object of the present invention to provide a frequency standard generator of a parallel system which is capable of switching from one function unit to a counterpart function unit without causing any fluctuations in the frequency or phase of the output standard frequency signal.

The standard frequency and timing generator of the present invention compiles frequency deviation data of a crystal oscillator during a normal operation period where a reference time signal is available and provides compensation data produced based on the frequency deviation data to the crystal oscillator during an abnormal operation period where the reference time signal is unavailable to regulate the oscillation frequency of the crystal oscillator.

The standard frequency and timing generator of the present invention includes: a voltage controlled crystal oscillator (VCXO) for generating high stability output signal to be used as a standard frequency and timing signal; a radio wave receiver which receives a radio wave which includes a high accuracy reference time signal and reproduces the reference time signal to be used as a reference for the VCXO; a time interval measuring circuit which measures a time interval which is a phase difference between the reference time signal and the output signal of the VCXO and generates data indicating the phase difference; a frequency control processor which arithmetically determines control data based on the phase difference data from the time interval measuring circuit such that the phase difference maintains a constant value by a phase lock loop; a frequency deviation data generator for averaging and compiling the phase difference data with a predetermined sequence to obtain frequency deviation trend data of the VCXO; a compensation data generator for generating compensation data based on the frequency deviation trend data to compensate frequency changes in said VCXO when the reference time signal is unavailable for the phase lock loop; a reference signal detector for generating a detection signal when the reference time signal is unavailable from said radio wave receiver for the phase lock loop; and a D/A converter which converts the control data from the frequency control processor and the compensation data from the compensation data generator to an analog voltage to be provided to the VCXO.

In another aspect of the present invention, the compensation data generator can generate a non-linear (curve-fit) compensation data. The curve-fit compensation data generator generates compensation data based on the frequency deviation trend data from the frequency deviation data generator by applying a Wavelet transform process to compensate curve like frequency changes in a free running oscillation state of the VCXO when the reference time signal is unavailable for the phase lock loop.

In generating the curve-fit compensation data, the compensation data generator applies an appropriate degree of low pass filter function derived from the Wavelet transform process to the frequency deviation trend data to determine a past trend curve of the frequency changes in the VCXO to produce the curve-fit compensation data to compensate a future trend curve of frequency changes in the VCXO.

The different degrees of the low pass filter function by the Wavelet transform process are derived by segmenting the frequency deviation trend data from the frequency deviation data generator to a plurality of levels each of the levels includes at least a pair of detail data $H_\alpha(\beta)$ and smooth data $L_\beta(\alpha)$, and changing the values of the detail data $H_\alpha(\beta)$ in selected levels to zero in an inverse Wavelet transform process. Alternatively, the different degrees of the low pass filter function by the Wavelet transform process are derived by segmenting the frequency deviation trend data from the frequency deviation data generator to a plurality of levels each of the levels includes at least a pair of detail data $H_\alpha(\beta)$ and smooth data $L_\beta(\alpha)$, and changing the values of the detail data $H_\alpha(\beta)$ in selected levels to an average value of a plurality of the detail data in an inverse Wavelet transform process.

A further aspect of the present invention is a method of generating a standard frequency and timing signal in which frequency deviation data of a crystal oscillator is accumulated during a normal operation period where a reference time signal is available and compensation data is produced based on the frequency deviation data and applied to the crystal oscillator during an abnormal operation period where the reference time signal is unavailable to regulate the oscillation frequency of the crystal oscillator.

The method of generating a high accuracy reference frequency signal and a timing signal of the present invention is comprised of the steps of: providing a voltage controlled crystal oscillator (VCXO) for generating a high stability oscillation frequency to be used as a standard frequency and timing signal; receiving a radio wave which includes a high accuracy reference time signal and reproducing the reference time signal; detecting a phase difference between the reference time signal and a time signal derived from the oscillation frequency of the VCXO and generating data indicating the phase difference; forming a phase lock loop for phase locking the oscillation frequency of the VCXO to the reference time signal by sending a control data based on the phase difference data; collecting the phase difference data with a predetermined sequence to obtain frequency deviation trend data of said VCXO; generating curve-fit compensation data based on the frequency deviation trend data by applying a Wavelet transform process to compensate frequency changes in a free running oscillation state of the VCXO when the reference time signal is unavailable for the phase lock loop; generating a detection signal when the reference time signal is unavailable from the radio wave for the phase lock loop; and converting the compensation data to an analog voltage and applying the analog voltage to the VCXO when the reference time signal is unavailable.

A further aspect of the present invention is a standard frequency and timing generator employing a parallel system for improving a long time reliability by enabling to replace one function unit with another rather than a standard generator as a whole.

The standard frequency and timing generator includes:
(a) a first frequency and timing generator comprising:
   a first receiver unit having a first satellite wave receiver for extracting a reference time signal from a radio wave signal;
   a first standard frequency generator unit having a first standard frequency generator;
   a first output unit having a first output circuit;
(b) a second frequency and timing generator comprising:
   a second receiver unit having a second satellite wave receiver for extracting said reference time signal from said radio wave signal;
   a second standard frequency generator unit having a second standard frequency generator;
   a second output unit having a second output circuit;
(c) a power divider for receiving said radio wave signal and distributing said radio wave signal to said first and second receiver units;
(d) an output terminal for providing a standard frequency and timing signal to an external system therefrom;
(e) switch means for selecting one of two counterpart units to send a signal from the selected unit to the units of later stages.
(e) a controller for receiving defect detection signals from each of said units and sending a control signal to said switch means to establish signal flows in said units toward said output terminal.

According to the present invention, the standard frequency and timing generator is capable of generating a high accuracy standard frequency and timing signal even when the ultra-high accuracy time signal such as GPS time signal is unavailable for phase locking the voltage controlled crystal oscillator. The standard frequency and timing generator of the present invention utilizes the voltage controlled quartz-crystal oscillator which is controlled to be phase locked to the GPS time signal. During the phase lock state, the present invention compiles frequency deviation data of the crystal oscillator and provides compensation data produced based on the frequency deviation data to the crystal oscillator during an abnormal operation period where the reference time signal is unavailable to regulate the oscillation frequency of the crystal oscillator.

The frequency standard and timing generator of the present invention is capable of maintaining the high accuracy of the frequency and timing generated therefrom without using a high stability crystal oscillator when an external reference signal is unavailable for a long period of time. In the frequency standard and timing generator of the present invention, the compensation data is produced by a mathematical process applied to the data showing the past trend of frequency deviation in the crystal oscillator used therein. An example of such mathematical process is a Wavelet transform process applied to the past trend data.

According to the present invention, the frequency standard generator using a parallel system is capable of improving an overall reliability thereof by replacing a defective block in one generator with the corresponding block in the other generator. The parallel system can switch from one function unit to a counterpart function unit when any defects are found in the function unit without affecting other performances of the standard frequency generator. Further, the parallel system of the present invention is capable of switching from one function unit to a counterpart function unit without causing any penalties in performance, such as fluctuations in the frequency of phase of the output standard frequency signal.

BRIEF DESCRIPTION OF THE DRAWINGS

FIGS. 6A–6C are diagrams showing variations in the oscillation frequency of the voltage controlled crystal oscillator when an external high accuracy reference signal is unavailable for a long period of time.

FIGS. 15A–15C are diagrams showing examples of situation where defective operations are involved in the parallel system of FIG. 14.

FIG. 16 is a chart including numerical data for explaining improvements of reliability in the parallel system of the present invention.

FIG. 19A is a circuit diagram showing a structure of an output unit in the parallel system of the present invention and FIG. 19B is a waveform diagram showing an phase control operation in the output unit of FIG. 19A.

DETAILED DESCRIPTION OF THE PREFERRED EMBODIMENT

Figure 1:
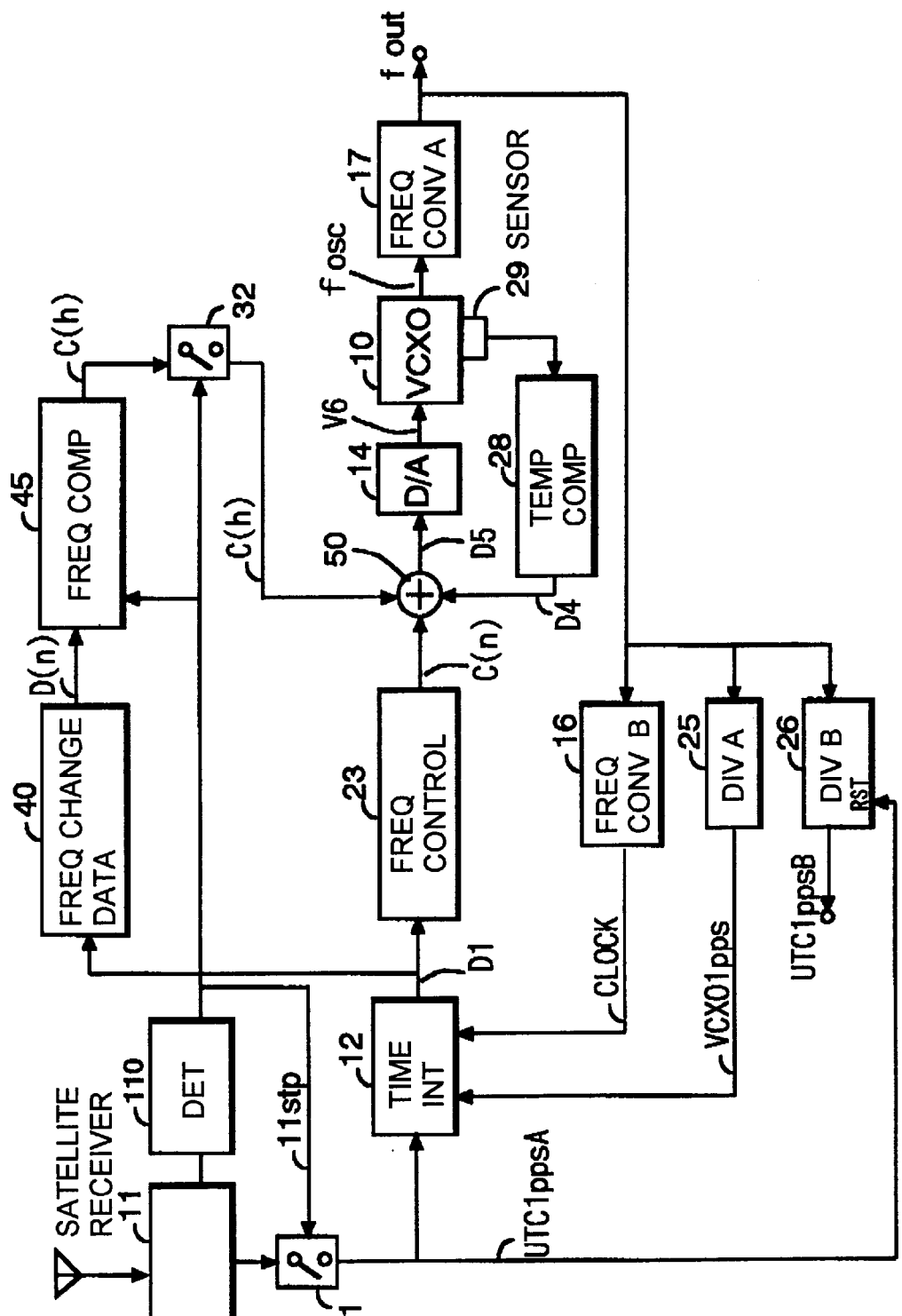
FIG. 1 is a schematic diagram showing an example of configuration of a standard frequency and timing generator of the present invention.

Various embodiments of the standard frequency and timing generator in accordance with he present invention will be described in the following with reference to the drawings.
Single System FIG. 1 is a block diagram showing a structure of the first embodiment of the present invention. In this example, when an ultra high accuracy reference signal, such as GPS time signal, is unable to be received from an outside source, such as an artificial satellite for a certain long period of time, a free running frequency of an internal crystal oscillator is compensated in a linear fashion based on the prior history of the crystal oscillator. A crystal oscillator, which has been run for a sufficiently long time such as several hundred to several thousand hours (aging), shows almost linear changes in its frequency relative to time passage. Thus, the linear compensation of the free running frequency can satisfy the accuracy of the standard frequency and timing generator of the present invention.

In FIG. 1, the frequency standard and timing generator includes a satellite wave receiver 11, a reference signal detector 110, switches 31 and 32, a time interval measuring circuit 12, a frequency control processor 23, a voltage controlled crystal oscillator (VCXO) 10, a temperature sensor 29 attached to the VCXO 10, a D/A (digital to analog) converter 14, frequency converters 16 and 17, frequency dividers 25 and 26, a signal adder 50, a frequency deviation data generator 40, and a frequency compensation data generator 45. An output frequency $f_{out}$ from the frequency converter 17 is used as a standard frequency signal, and an output time signal $UTC_{1pps}$ from the frequency divider 26 is used as a standard timing signal.

The satellite wave receiver 11 receives a radio wave from an artificial satellite which includes an ultra high accuracy reference signal. An example of such a satellite is a GPS (Global Positioning System) satellite which generates, among others, a GPS time signal $GPS_{1pps}$ having a one second repetition rate (pulse per second). The GPS time signal is originated from an ultra-high accuracy atomic frequency standard installed in the GPS satellite. However, the GPS time signal includes a short term noise intentionally imposed thereon because of the military reasons. The receiver 11 reproduces the GPS satellite time signal to be used as a reference clock for the voltage controlled crystal oscillator (VCXO) 10 when a phase lock loop is established.

The reference signal detector 110 monitors the satellite wave receiver 11 to determine whether the GPS satellite time signal is available. If the GPS time signal is unavailable for some reasons, the reference signal detector 110 generates a detection signal indicating the unavailability of the GPS reference time signal.

The frequency divider 25 and 26 divide the output signal of the VCXO 10 by a dividing ratio predetermined to generate a crystal time signal $VCXO_{1pps}$ and a standard timing signal $UTC_{1pps}$ which is synchronized with the GPS timing signal ($GPS_{1pps}$ or UTC reference signal) from the satellite. The time interval measuring circuit 12 measures a phase difference between the satellite time signal $GPS_{1pps}$ and the crystal time signal $VCXO_{1pps}$ and generates a digital data D1 indicating the phase difference.

The switch 31 is to disconnect the output of the satellite wave receiver 11 to the time interval measurement circuit 12 when the reference signal detector 110 indicates that the reference signal is unavailable. The switch 32 is to connect the output of the frequency compensation data generator 45 to the signal adder 50 when the reference signal detector 110 indicates that the reference signal, such as the GPS time signal, is unavailable.

The frequency control processor 23 receives the phase comparison (difference) data D1 from the time interval measuring circuit 12 and produces a phase (frequency) control data C(n) representing the phase difference. The frequency control processor 23 also produces various phase lock parameters which determines a response characteristics of the phase lock loop (PLL) such as a loop gain and a loop bandwidth. For example, to remove the short term noise intentionally incorporated in the satellite radio wave, the frequency control processor 23 functions as a digital low pass filter of a very long time constant such as several hundred to one thousand seconds.

The D/A converter 14 receives the frequency control signal from the frequency control processor 23 and converts the frequency control signal to an analog voltage which is supplied to the VCXO 10. The oscillation frequency of the VCXO 10 is feedbacked to the time interval measuring circuit 12 through the frequency divider 25. The division ratio of the divider 25 is determined so as to produce a 1 pps pulse rate from the output of the VCXO 10 to be supplied to the time interval measuring circuit 12. The voltage controlled crystal oscillator 10 includes a quartz-crystal oscillator which has, for example, frequency stability of $5 \times 10^{-10}$/day and a variable frequency range ($\Delta f/f$) of $2 \times 10^{-7}$ which is regulated by the control voltage received.

In this example, the output of the VCXO 10 is also used as a clock signal for the time interval measuring circuit 12 through the frequency converter 16. The frequency converter 16 is typically a frequency multiplier to produce a clock signal whose frequency is high enough, for example several ten megahertz, to obtain a required level of resolution in measuring the time interval by the time interval measuring circuit 12.

The temperature sensor 29 monitors the temperature changes in the VCXO 10 and provides a signal indicating the temperature changes to the temperature compensation circuit 28. The temperature compensation circuit 28 produces temperature compensation data which is returned to the VCXO 10 through the signal adder 50 and the D/A converter 14 for compensating the frequency changes due to the changes in the temperature in the VCXO 10.

The frequency deviation data generator 40 and the frequency compensation data generator 45 are used in a case where the GPS satellite time signal is not available as will be described later. The free running frequency of the VCXO 10 is compensated in such a case by the compensation data produced by the data generators 40 and 45 to maintain the free running oscillation frequency of the VCXO 10 substantially equal to the that of the phase locked frequency of the VCXO 10.

The frequency deviation data generator 40 stores the measured data indicating the frequency deviation in the VCXO 10 to be used in such a situation where the GPS satellite time signal cannot be received by the satellite wave receiver 11. The frequency deviation data generator 40 receives the difference data D1 from the time interval measuring circuit 12 at every second and determines the frequency deviation data indicating the free running oscillation frequency of the VCXO 10 when the phase lock loop would be in an unlock situation (because the satellite time signal is unavailable). Since the GPS satellite time signal includes noise or interference signals intentional superimposed, the frequency deviation data will be determined by averaging sufficient numbers of difference data D1 from the time interval measuring circuit 12.

The frequency compensation data generator 45 receives the frequency deviation data from the data generator 40 and produces the frequency compensation data to be supplied to the VCXO 10. The output of the frequency compensation data generator 45 is enabled by the switch 32 when the ultra high accuracy reference signal cannot be obtained through the satellite radio wave. Thus, the output data of the frequency compensation data generator 45 controls the free running oscillation frequency of the VCXO 10.

Reference Signal Received

Figure 5:
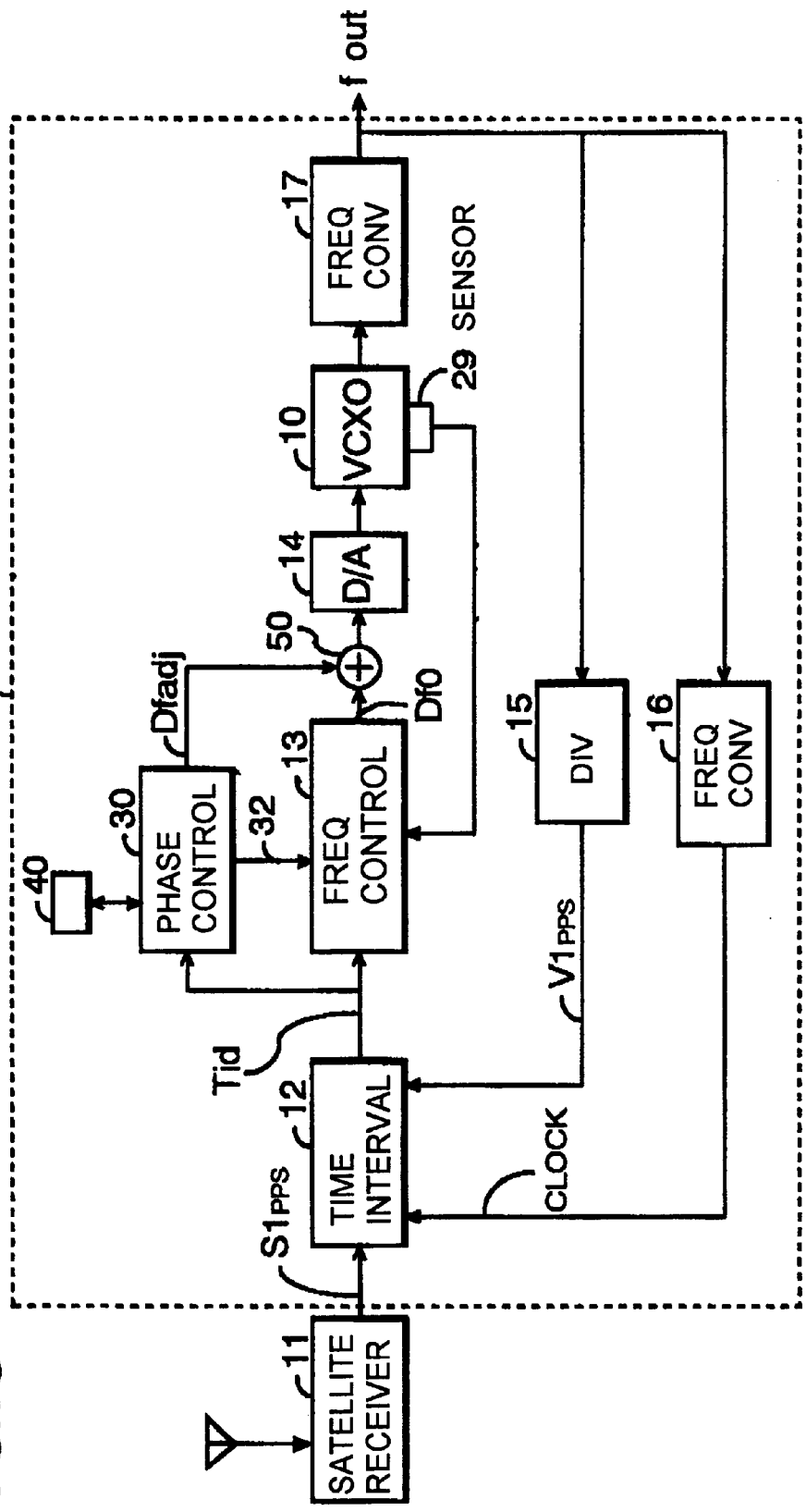
FIG. 5 is a schematic diagram showing an example of structure of a frequency standard generator in the conventional technology.

In the standard frequency and timing generator of FIG. 5, when the satellite time signal is properly provided to the time interval measuring circuit 12, the phase lock loop (PLL) controls the oscillation frequency of the VCXO 10 by regulating the voltage thereto. The PLL functions to regulate the frequency of the VCXO 10 by parameters controlled by the frequency control processor 23 such as a large time constant of the closed loop. Therefore, a time interval or phase difference between the ultra high accuracy satellite time signal $GPS_{1pps}$ from the satellite wave receiver 11 and the crystal time signal $VCXO_{1pps}$ is regulated to be constant.

The frequency control processor 23 dynamically determines the frequency control signal and the phase lock parameters based on the phase difference between the satellite time signal $GPS_{1pps}$ and the crystal time signal $VCXO_{1pps}$. The details of the function of the frequency control processor 23 is shown in the U.S. Pat. No. 5,629,649 issued to Ujiie. The following is a brief description of the frequency control operation involved in the frequency control processor 23.

Although not shown, the frequency control processor 23 is mainly formed of a computer (CPU) and a buffer memory. The buffer memory stores the measured data from the time interval measuring circuit 12. An estimation computing unit takes out the stored data from buffer memory and performs an estimation computing process based, for example, on a moving average method. Since the GPS time signal is a one-pulse per second (1 pps) signal, the repetition rate of which is too low to control the crystal oscillator at high speed. Thus, it is preferable to divide the one second period into 10 or 1000 so that the control signals are generated every one millisecond or hundred millisecond. Thus, the estimation computing unit performs its computing process, for example, 1000 times per second. Such a number of computing process is controlled to attain an appropriate speed of the phase lock loop.

For example, when the phase difference data D1 from the time interval measuring circuit is greater than a predetermined value, the frequency control processor 23 sets a first control mode in which it controls the phase lock loop to increase the response speed by decreasing the number of data used for moving averaging process. In this situation, the frequency control processor 23 also increases the proportional constant and decreases the integration constant so that a frequency pull-in time of the loop becomes small. The phase lock loop under these parameters has a larger bandwidth which promotes a frequency pull-in at high speed while the phase synchronization accuracy will be low.

When the frequency pull-in is progressed to a certain degree, and thus, the difference data D1 becomes smaller, the frequency control processor 23 sets the next control mode in which the number of data for the moving average computation is increased, the proportional constant is decreased while the integration constant is increased. In this manner, by changing the control modes step by step, the phase lock loop is controlled to accomplish an optimum response characteristics.

The proportional value and the integration value are added by the signal adder 50 to produce a control signal for voltage controlled crystal oscillator 10. At the later stage of this control process, the frequency of the voltage controlled crystal oscillator 10 is shifted to the complete synchronous state from the frequency pull-in state. In this mode, the number of data used for the moving average computation is further increased, the proportional constant is decreased while the integration constant is increased. In the situation of the complete synchronization, the phase lock loop has an extremely narrow frequency band, i.e., a cut off frequency of an equivalent loop filter of the phase lock loop is very low. Therefore, jitters and fluctuations in a radio wave or a communication line are effectively suppressed. Further, since the loop frequency is extremely low or a time constant of the phase lock loop is extremely large, the output frequency of the frequency standard generator of the present invention maintains its accuracy even when the satellite time signal is not given for a certain period of time by an unexpected accident or the like.

Reference Signal Not Received

When the GPS satellite time signal is unavailable in the radio wave from the satellite, the standard frequency and timing generator of the present invention controls the free running frequency of the VCXO 10 to be substantially equal to the phase locked frequency of the VCXO 10. In the case where the GPS satellite time signal is not provided to the PLL circuit, the VCXO 10 is shifted to the free running state since the negative feedback control is no longer effective. To continuously provide the standard frequency and timing signals with high accuracy to a communication system, during such a period, the present invention controls the free running oscillation frequency of the VCXO 10 based on the past frequency deviation data.

During the time when the GPS satellite time signal is received, the frequency deviation data generator 40 receives the difference data D1 from the time interval measuring circuit 12 at every second and averages the frequency deviation data. By acquiring a large number of data corresponding to a long period of time, such as 24 hours, the free running oscillation frequency of the VCXO 10 at present can be regulated by the compensation data derived from the deviation data. Thus, when the GPS time signal is absent, the free running oscillation frequency, and thus the crystal time signal $VCXO_{1pps}$ can be maintained substantially equal to the satellite time signal $GPS_{1pps}$. By the trend shown in the past frequency deviation data, are also known the future frequency changes in free running oscillation of the VCXO 10 which can be compensated.

Figure 2A:
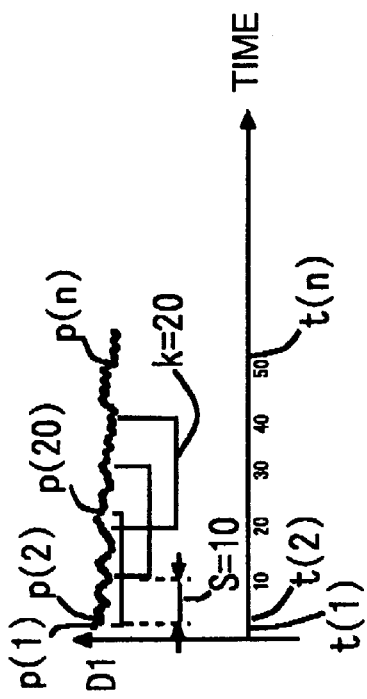
FIGS. 2A–2C are diagrams of the present invention showing methods of obtaining average frequency deviations of a voltage controlled crystal oscillator relative to time passage and an example of fluctuations in the average frequency deviations.
Figure 2B:
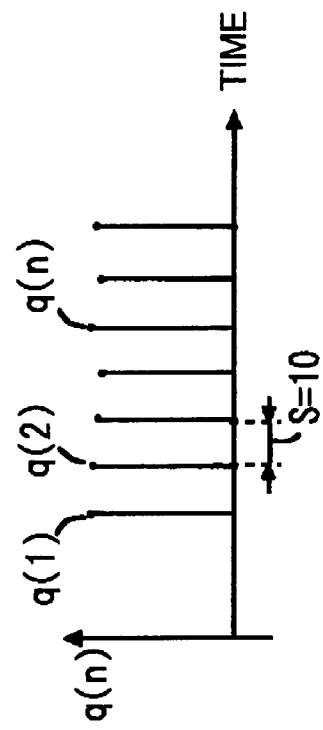
Figure 2C:
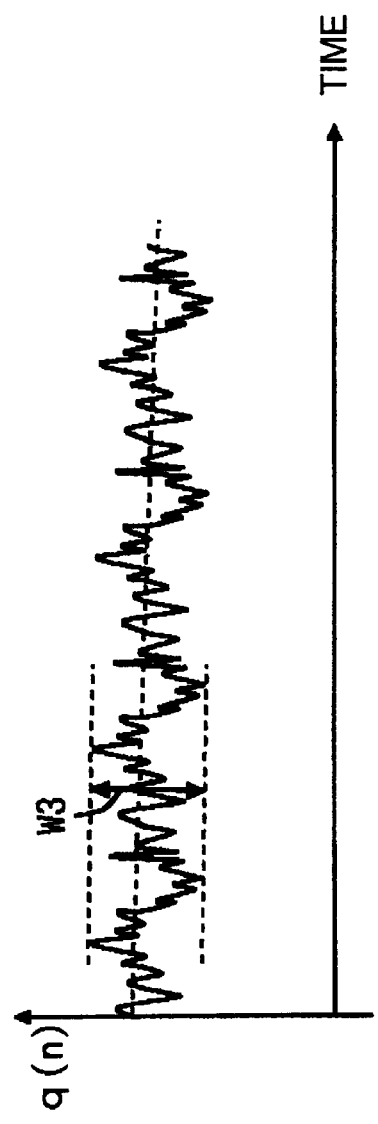

As noted above, since the satellite time signal includes noise or interference signals intentional superimposed, the frequency deviation data will be determined by averaging sufficient numbers of difference data D1 from the time interval measuring circuit 12. An example of procedure for producing frequency deviation data D(n) by the frequency deviation data generator 40 is shown in FIGS. 2A–2C. In FIG. 2A, based on the measured data D1 from the time interval measuring circuit 12, a corresponding deviation data sample at a time t(1) is expressed by p(1) . similarly, a deviation data sample at a time t(2), which is one second after t(1), is expressed by p(2), and a deviation data sample at a time t(n) is expressed by p(n).

In the example of FIG. 2, a plurality of consecutive data samples are acquired and an average q(n) for each set of the plural data samples is calculated and stored in a memory of the frequency deviation data generator 40. This averaging procedure is to improve measurement accuracy as well as to remove the short term noise included in the GPS satellite time signal. More specifically, in the example of FIG. 2A, twenty consecutive data samples are averaged at every predetermined interval S such as ten seconds. For example, twenty data samples p(1)–p(20) are averaged to produce an average value q(1). Ten seconds after that, in the next interval S, twenty data samples p(11)–p(30) are averaged to produce an average value q(2). Similarly, further ten seconds after, in the next interval S, twenty data samples p(21)–p(40) are averaged to produce an average value q(3). The average values q(1), q(2), q(3), . . . q(n) and the corresponding time data t(1), t(2), t(3) . . . t(n) are stored in the memory.

FIG. 2B shows the plots of the average values q(1), q(2), q(3), . . . q(n) obtained in the above procedure. FIG. 2C is an enveloped illustration of the average values of FIG. 2B. Since the average data in FIGS. 2B and 2C show the frequency deviation of the VCXO 10 in a relatively short period of time, such as several minutes, it may be difficult to find out the long range frequency change in the VCXO 10 relative to time passage. One of the reasons is that the frequency fluctuations w3 such as shown in FIG. 2C are too large to determine the trend of the long term frequency change in the VCXO 10. By increasing the number of data samples in the above procedure, the frequency fluctuations w3 will be decreased.

Figure 3:
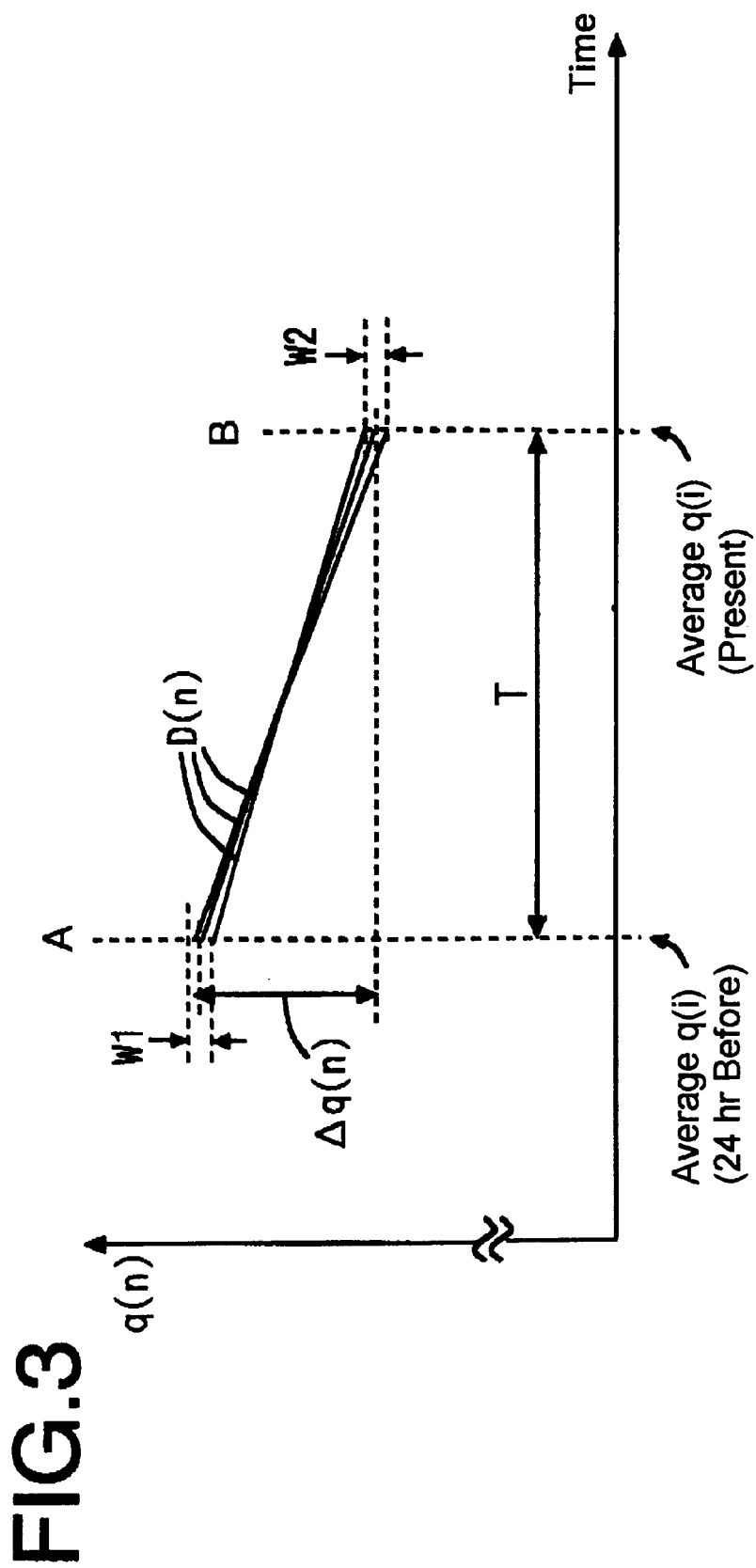
FIG. 3 is a diagram showing a method of calculating frequency deviations of a voltage controlled crystal oscillator in accordance with the present invention.

To know the frequency change versus time passage in the VCXO 10, the average frequency deviation between a very long time T, such as 24 hours, is evaluated. FIG. 3 shows the frequency deviation data obtained in the data generator 40 of the present invention. Since a crystal oscillator, after sufficient aging, shows a frequency change which is almost linear with the passage of time, a relatively clear frequency change is found in the deviation data obtained in such a long period of time. The frequency fluctuations w1 and w2 in FIG. 3 can be negligible compared with the large change in the long period of time.

In the case where the frequency fluctuations w1 and w2 are not negligible or the time length T of 24 hours is too long for a particular application, it is preferable to increase the number of data samples for obtaining the average deviation q(i) and q(j). The frequency fluctuations w1 and w2 will be decreased accordingly. The time length T for determining the frequency deviation D(n) can be decreased to, for example, several hours.

In FIG. 3, the frequency deviation D(n) can be determined by D(n)={q(i)−q(j)}/T=q(n)/T, where q(i) is the average frequency deviation of 24 hours ago and q(j) is the average frequency deviation at present, and the length of time T is 24 hours. Based on this relationship, the frequency deviation data D(n) is calculated at every predetermined interval such as ten seconds and transferred to the frequency compensation data generator 45.

The frequency compensation data generator 45 receives the frequency deviation data D(n) from the data generator 40 and produces frequency compensation data C(h) to be supplied to the VCXO 10 via the D/A converter 14. The output of the frequency compensation data generator 45 is enabled by the switch 32 when the ultra high accuracy reference signal (GPS time signal) cannot be obtained through the satellite radio wave. Thus, the output compensation data C(h) of the frequency compensation data generator 45 controls the free running oscillation frequency of the VCXO 10.

The compensation data C(h) for controlling the free running oscillation frequency of the VCXO 10 is applied to the VCXO 10 through the signal adder 50 and the D/A converter 14. The compensation data C(h) is to compensate the changes in the free running oscillation frequency of the VCXO 10 anticipated by the past frequency change curve. As a result of which, the oscillation frequency of the VCXO 10 is maintained within an acceptable accuracy range even when the GPS satellite time signal is unavailable.

The frequency change in the VCXO 10 when it is in the free running oscillation mode is expressed as follows:

$$y(x)=r(x)+G\cdot x+y0$$

where x represents a time started from zero at the start of the free running operation of the VCXO 10, r(x) represents random noise based on the VCXO 10 and the associated circuits, G is a proportional constant showing the linear change in the free running frequency of the VCXO 10, y0 is an offset frequency of the VCXO 10 from the ideal frequency corresponding to the satellite time signal. The random noise r(x) is small enough and can be negligible, and the offset y0 is also small enough when the phase lock loop works properly until immediately before the VCXO goes into the free running mode. Therefore, the compensation data C(h) by the compensation data generator 45 is expressed as C(h)=K·G·x, where K is a proportional constant to adjust the compensation data to an appropriate voltage level of the D/A converter 14. Consequently, the output voltage of the D/A converter 14 controls the frequency of the VCXO 10 so that the oscillation frequency thereof maintains substantially the same frequency as oscillation frequency of the VCXO 10 which is feedback controlled with reference to the GPS time signal.

Figure 4:
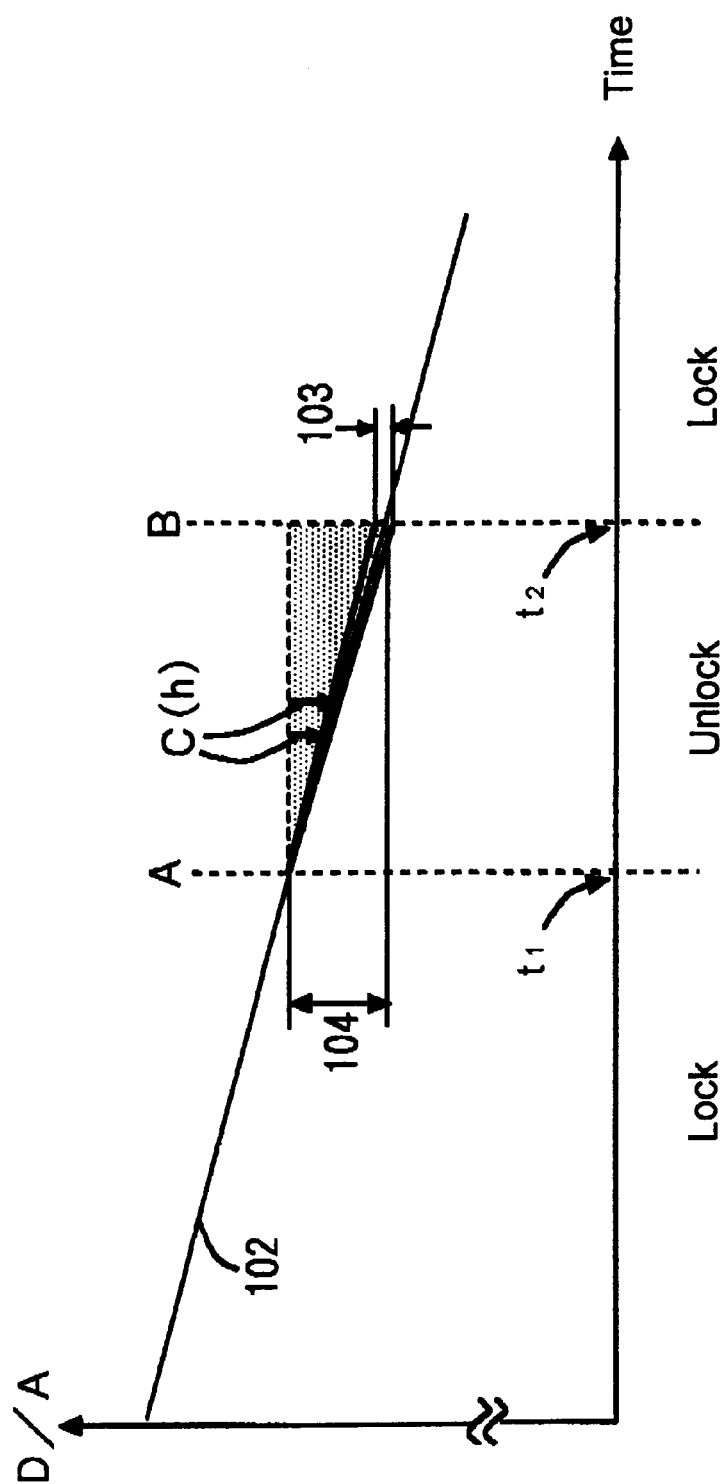
FIG. 4 is a diagram showing a method of calculating data for compensating frequency deviations in a free running mode of a voltage controlled crystal oscillator in accordance with the present invention.

The frequency change versus time passage in the VCXO 10 in the standard frequency generator of the present invention is shown in FIG. 4. The vertical axis of FIG. 4 is the data to the D/A converter which supplies a corresponding output voltage to the VCXO 10 to control its oscillation frequency. In FIG. 4, until the time A, the standard frequency generator is in the normal operation wherein the GPS time signal from the satellite is received and is used as a reference clock signal to the PLL circuit. During that period, the control data 102 to the D/A converter 14 and thus, to the VCXO 10 is automatically produced by the PLL circuit to maintain the frequency of the VCXO 10 constant (phase locked to the GPS time signal).

Between the time A and time B in FIG. 4, it is assumed that the GPS time signal is not received for some reasons. Since the reference signal to the PLL circuit is not provided, the phase lock operation is not effective, and thus the VCXO 10 is in the free running mode. During this period however, the frequency compensation data generator 45 provides the compensation data C(h) to the D/A converter 14 to maintain the oscillation frequency of the VCXO 10 identical to that phase locked to the GPS time signal. Since the compensation data C(h) is produced based on the past trend of the VCXO 10 as in the foregoing, the compensation data C(h) is substantially on the same line of the data 102 as shown in FIG. 4.

The data 104 in FIG. 4 shows the actual frequency change while the data 103 shows a difference (error) between the data 104 of the actual frequency change and the compensation data C(h). As result of the present invention which provides the compensation data by anticipating the future frequency change of the VCXO based on the past frequency change, the error 103 can be decreased to less than 10 percent (10%) of that without the compensation.

Further, since the frequency difference (error) 103 is very small, at the time B when the GPS time signal is again available and thus the PLL circuit is in active, the oscillation frequency of the VCXO 10 is immediately phase locked to the GPS time signal. According to the present invention, the time required for the oscillation frequency of the VCXO 10 to be phase locked is also decreased to, for example, less than ten percent (10%) of that without using the compensation.

The compensation data for compensating the free running oscillation frequency of the VCXO 10 can also be calculated in the following manner:

As noted above, the frequency deviation data D(n) for the time length T is D(n)={q(i)−q(j)}/T as shown in FIG. 3 where q(i) is the average frequency deviation at the time T before and q(j) is the average frequency deviation at present. By renewing the frequency deviation data at every predetermined time interval, the frequency deviation data D(L) immediately before the free running of the VCXO 10 can be determined. It is assumed that the minimum and maximum data of the D/A converter are $A_{min}$ and $A_{max}$, respectively, and the corresponding minimum and maximum oscillation frequency of the VCXO 10 are $F_{min}$ and $F_{max}$, respectively. Then the frequency resolution R per one (1) digit of the D/A converter (14 is R=$(F_{min}-F_{max})/A_{max}-A_{min}$) Thus, the data A(i) of the D/A converter 14 for the oscillation frequency at the start of the free running of the VCXO is A(i)={D(L)/R}+$A_{min}$. The above noted minimum and maximum data of the VCXO 10 can be measured and renewed at a predetermined time interval.

As in the foregoing, according to the standard frequency and timing generator of the present invention, the free running frequency of the VCXO 10 is controlled to be substantially equal to the phase locked oscillation signal even when the GPS time signal is not available.

Figure 7:
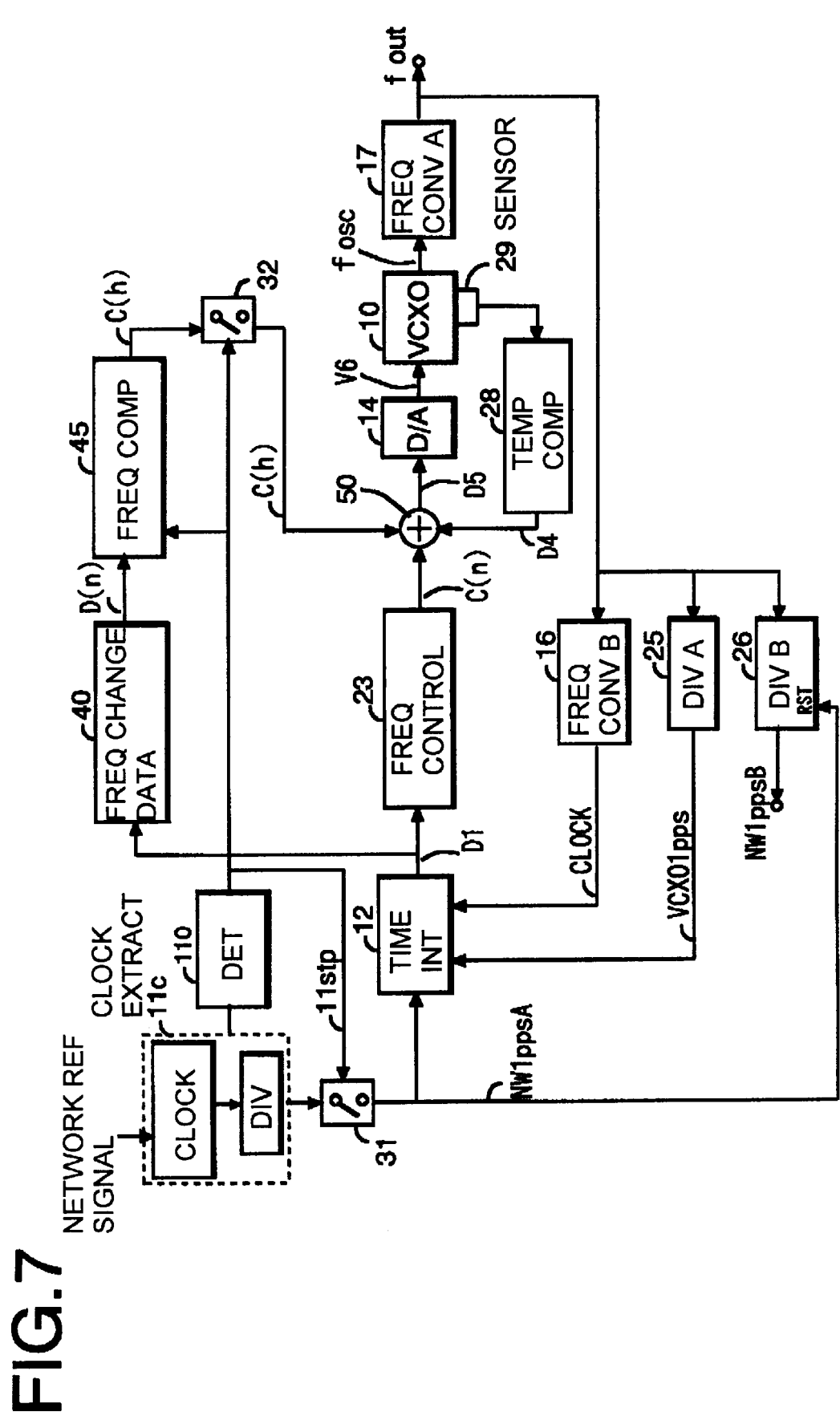
FIG. 7 is a schematic diagram showing another example of configuration of the standard frequency and timing generator of the present invention.

In the foregoing, the standard frequency and timing generator extracts the ultra high accuracy reference signal in the satellite radio wave. It is also possible to detect the high accuracy reference signal from the communication or broadcast networks as shown in FIG. 7. The example of FIG. 7 includes a communication and broadcast network receiver 11c instead of the satellite wave receiver 11 of FIG. 1. The receiver 11c receives communication radio wave including a standard frequency signal emitted in the communication or broadcast network. Such a standard frequency signal is typically originated from an atomic standard frequency generator.

For extracting the standard frequency signal, the receiver 11c may include a clock detection circuit for detecting a standard frequency signal in the received signal and a frequency divider to divide the standard frequency signal to lower frequency standard signal. In this case, the output frequency $f_{out}$ is phase locked to the communication or broadcast standard frequency of the communication network or broadcast network. Moreover, since the frequency standard generator of the present invention includes a phase lock loop of a large time constant, jitter or wander in the standard frequency is removed at the output frequency $f_{out}$.

In such communication networks and broadcast networks, very high accuracy and stability frequency standard signals are provided at original or main stations. However, such communication networks are connected in many layers of subordinate networks through long distance cables or microwave relay stations. Consequently, the standard frequency signals reproduced at lower layer stations tend to be superimposed with phase noise or other fluctuations in the phase and frequency.

Moreover, since the standard frequency signals are transmitted in the same lines where information data are transmitted, the standard frequency signals are scrambled with other signals such as alternate mark inversion (AMI) codes in discontinuous PCM signals. Thus, a phase lock loop is necessary to extract the standard frequency signal in demodulated signals. However, such an extraction means can also be affected by the short noise or phase noise. Further, such a standard frequency signal from the communication network are sometimes difficult to receive for various causes.

Therefore, the present invention as shown in the block diagram of FIG. 7 is useful in generating the standard frequency and timing signals based on the reference signal (standard frequency signal) from the communication network. Because of the large time constant in the phase lock loop in the standard frequency and timing generator of the present invention, the short term noise and phase noise in the reference signal are removed. Moreover, in the case where the reference signal from the communication network is absent or unavailable for a relatively long period of time, the free running frequency of the VCXO 10 is controlled to be substantially equal to the oscillation signal phase locked to the reference signal.

Figure 8:
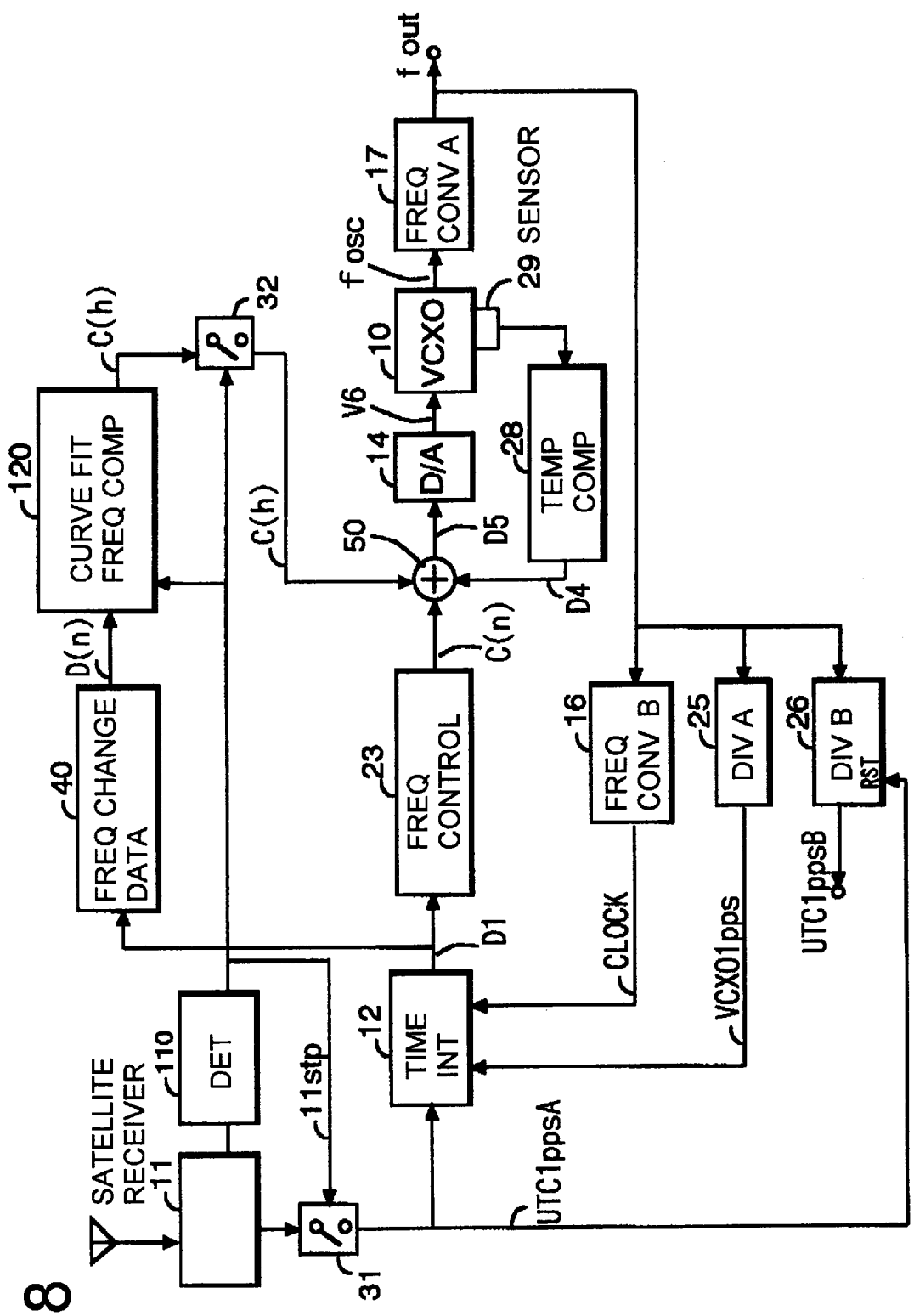
FIG. 8 is a schematic diagram showing a further example of configuration of the standard frequency and timing generator of the present invention.

Further aspect of the present invention is shown in the block diagram of FIG. 8 in which curve-fit estimated compensation data is produced when the ultra high accuracy reference signal is absent. In the earlier example of FIGS. 1 and 7, the compensation data is generated based on the linear estimation of the frequency deviation of the VCXO 10. However, in the standard frequency and timing generator of FIG. 8, the frequency deviation in the VCXO in the free running oscillation is considered to show a curve rather than a straight line. Thus, a curve-fit compensation data is generated by a curve-fit compensation data generator 120 which is provided to the VCXO 10 when the GPS time signal is unavailable from the satellite.

The curve-fit compensation data generator 120 estimates a frequency deviation curve of the VCXO 10 for a relatively long time period during which the PLL circuit is not working. The compensation data generator 120 has a memory which stores the frequency deviation data D(n) from the frequency deviation data generator 40. Based on the frequency deviation data D(n), the compensation data generator 120 generates an estimated compensation curve (curve-fit compensation data) to be supplied to the VCXO 10.

In the present invention, the compensation curve is created through a mathematical algorithm such as a Wavelet transform using a multi-resolution analysis method. As will be describe later, the Wavelet transform can create low pass filters of various degrees to match the frequency deviation of the VCXO. When the reference signal detector 110 indicates that the GPS time signal is absent, the curve-fit compensation data C(h) is supplied to the VCXO 10 through the switch 32, the signal adder 50 and the D/A converter 14.

A low pass filter function based on the Wavelet transform process is given briefly in the following. The low pass filter is necessary to remove high frequency components and short term noise in the large amount of frequency deviation data D(n) to determine the long range curve in the frequency deviation of the VCXO 10. Harr Wavelet transform is known to suitably establish such a low pass filter. It is also known in the art that the Wavelet transform involves arithmetic processes of segmentation (decomposition) while the inverse Wavelet transform involves arithmetic processes of reconstruction (composition).

Figure 9:
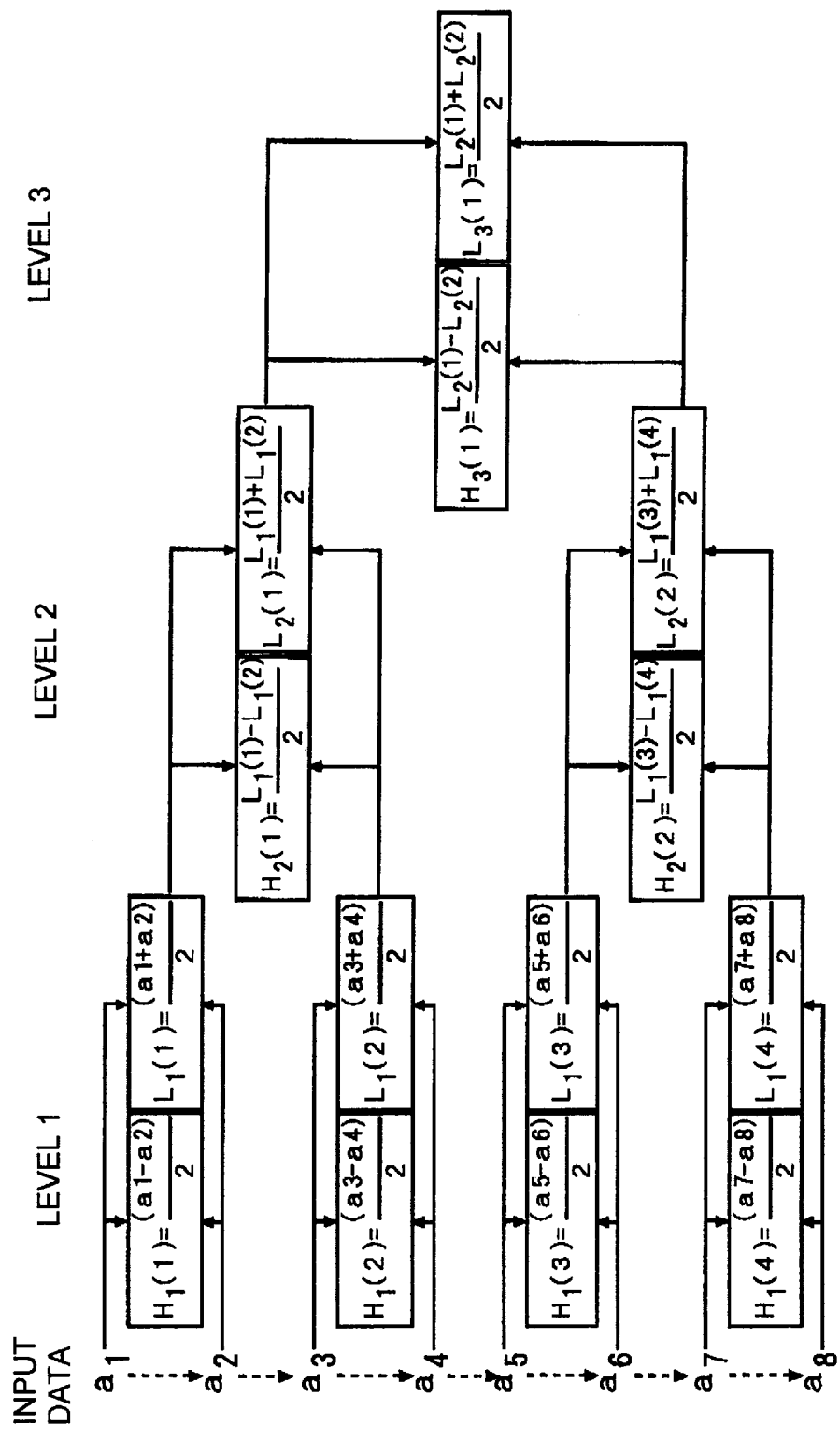
FIG. 9 is a diagram for explaining a segmentation operation process in a wavelet transform for producing compensation data in the present invention.

The segmentation operation processes in the Wavelet transform using the Harr base function is shown in FIG. 9. For simplicity of explanation, this example of FIG. 9 shows only eight (8) input data samples, i.e., a1–a8. Under this condition, the arithmetic process is segmented to three levels (layers), level 1, level 2 and level 3 as shown in FIG. 9. In each segmented level, one or more of pairs of data are created in which $H_\alpha(\beta)$ indicates smooth data and $H_\beta(\alpha)$ indicates detail data, $\alpha$ indicates a multi-resolution analysis level (level number) and $\beta$ indicates a time sequential number of the input data samples.

In the level 1 ($\alpha$=1), detail data $H_1(1)$=(a1–a2)/2 as shown in the left side of FIG. 9 is produced. This data indicates a difference between two data samples and thus has high frequency components. Also in the level 1 ($\alpha$=1), the smooth data $L_1(1)$=(a1+a2)/2 as shown in the left side of FIG. 9 is produced. This data indicates an average between the two data samples and thus has low frequency components. Similarly, the level 1 operation is carried out for the input data samples a3–a8, thereby producing detail data $H_1(2)$, $H_1(3)$ and $H_1(4)$ and smooth data $L_1(2)$, $L_1(3)$ and $L_1(4)$. As noted above, the smooth data $L_1(\beta)$ thus created is time sequence data having an effect of a low pass filter.

In the level 2 ($\alpha$=2), a pair of detail data $H_2(1)$ and smooth data $L_2(1)$ and another pair of detail data $H_2(2)$ and smooth data $L_2(2)$ are respectively created in the segmentation process as shown at about the center of FIG. 9. Similarly, In the level 3 ($\alpha$32 3), a pair of detail data $H_3(1)$ and smooth data $L_3(1)$ are respectively created in the segmentation process as shown at the right of FIG. 9. Since the smooth data $L_3(l)$ shows an average of all the input data samples a1–a8, this data can be used as the compensation data C(h) in the embodiment such as shown in FIG. 1 in which the frequency change in the free running oscillation of the VCXO 10 is considered to be linear.

Figure 10:
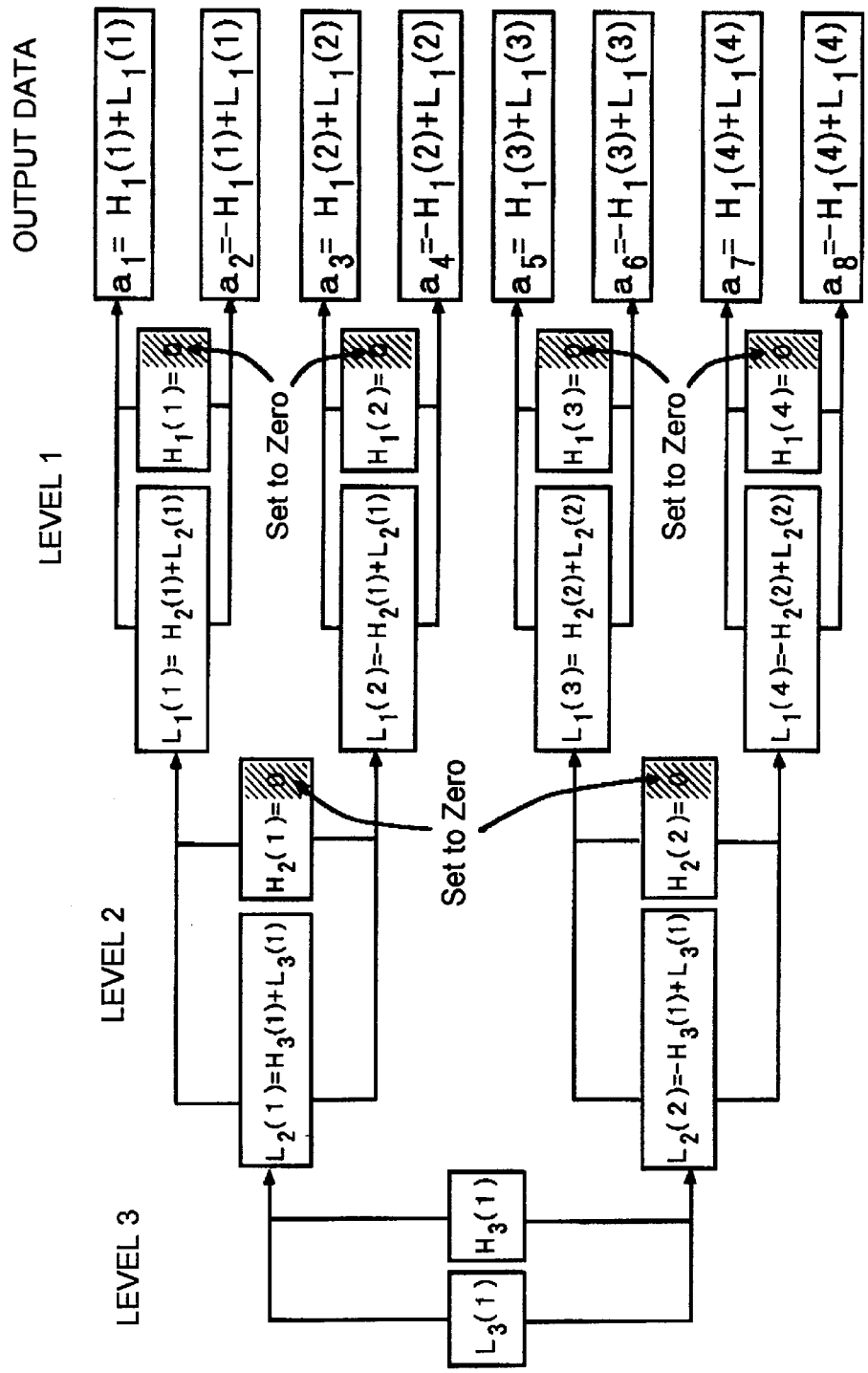
FIG. 10 is a diagram for explaining a reconstruction operation process in an inverse Wavelet transform for producing compensation data in the present invention.

In the inverse Wavelet transform, as shown in FIG. 10, the operational process which is opposite to that shown in FIG. 9 is carried out. Namely, the arithmetic operation from the level 3, level 2, to level 1 is performed to reconstruct the input data samples a1–a8. By utilizing the characteristics of the inverse Wavelet transform, a desired low pass filter response can be created. For doing this, the detail data $H_\alpha(\beta)$ in a specified level is set to zero or an average value to be used in the inverse Wavelet transform process. The average value in this case means an average of the detail data $H_\alpha(\beta)$ in the intended level. By setting the detail data to either zero or average values as noted above, the low pass filter response curve of desired characteristics can be produced.

An example of such a reconstruction operation process is shown in FIG. 10. In this example, the detail data $H_1(1)$, $H_1(2)$, $H_1(3)$ and $H_1(4)$ in the level 1 and the detail data $H_2(1)$ and $H_2(2)$ in the level 2 are set to zero as shown by the shaded portions in the drawing. The resultant data samples composed in this manner show data in which high frequency components are removed by the intended low pass filter.

In the above example, there are only three levels because of eight samples in the input data. However, in an actual system using the Harr Wavelet transform, the number of data to be used is far larger such as $2^{16}$=65536 words. Thus, 16 levels of operational (segmented) layer will be involved in the decomposition and composition process as described above. The larger the number of levels, the lower it becomes the cut off frequency of the low pass filter.

Figure 11:
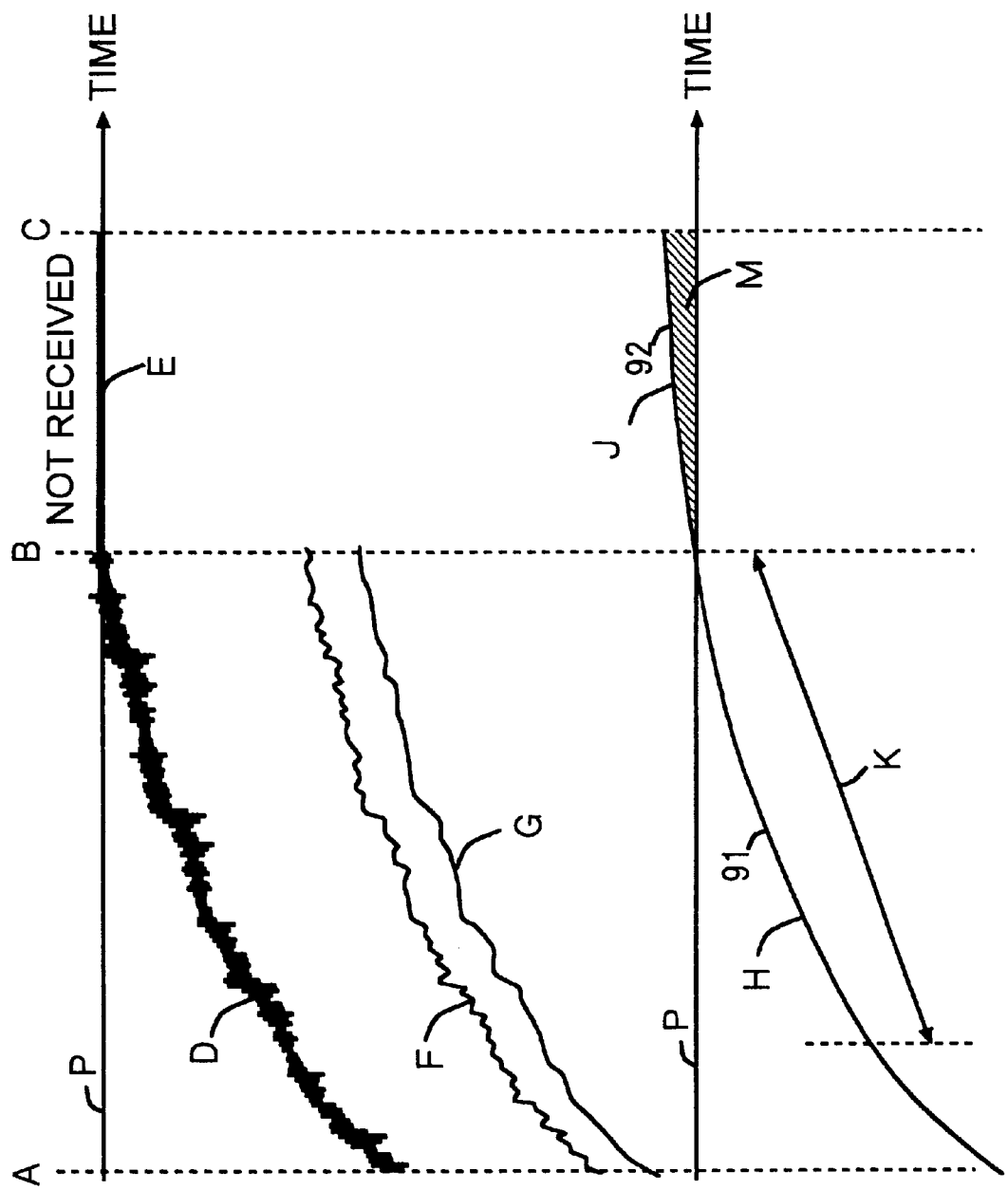
FIG. 11 is a diagram showing various levels of curves representing the past frequency deviations in the voltage controlled crystal oscillator to produce estimated compensation data in the present invention.
Figure 12:
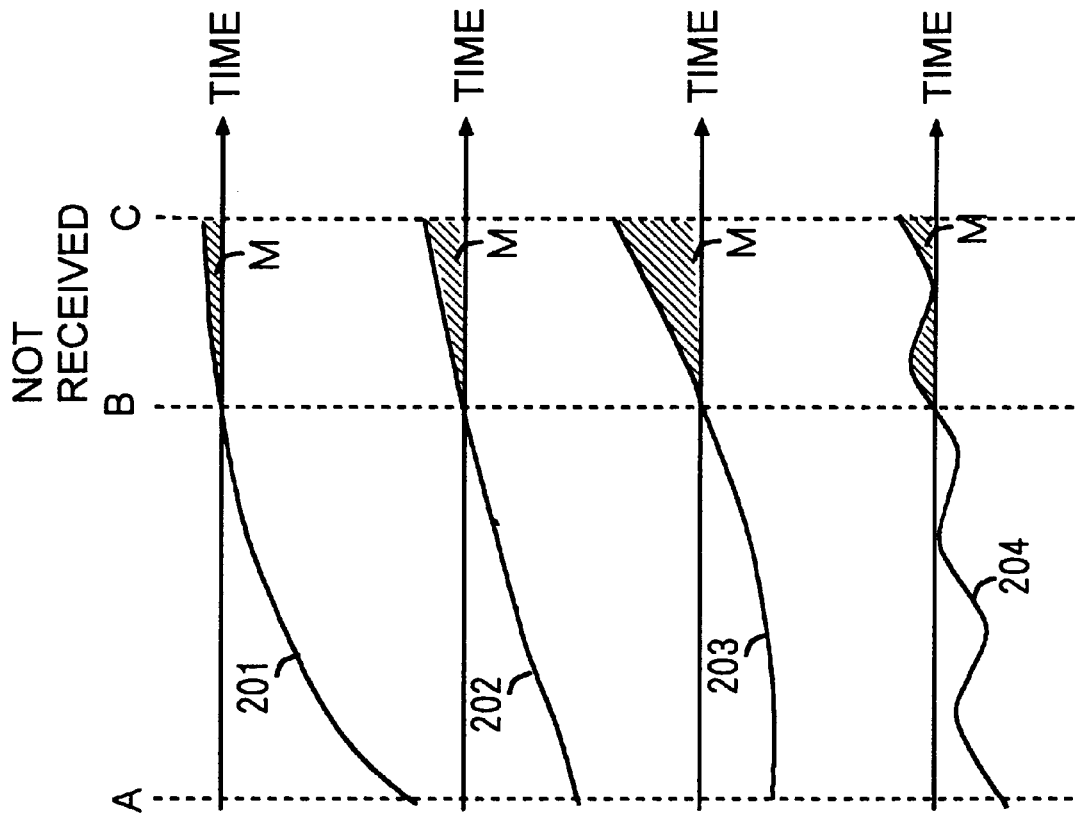
FIG. 12 is a diagram showing various types of frequency deviation curves involved in voltage controlled crystal oscillators.

Based on the advantages in the Wavelet transform method described above, the operation of the curve-fit compensation data generator 120 of the present invention is described with reference to FIGS. 11 and 12. In FIGS. 11 and 12, a time period defined by A and B indicates a normal state of operation. In the normal state, the ultra high accuracy reference signal such as a GPS time signal is received by the standard frequency and timing generator. Thus, the PLL circuit therein is active to phase lock the oscillation frequency of the VCXO 10.

A time period defined by B and C indicates an abnormal state of operation. In this abnormal state, the reference signal is not available for some reasons, thereby the PLL circuit is out of lock, resulting in the free running of the VCXO 10. To maintain the output frequency of the standard frequency generator, the frequency variations during the period of the abnormal state is estimated by a curve J so that the VCXO 10 is compensated by the curve-fit values designated by the shade M in FIG. 11.

The time period between A and B may be as long as several ten hours for the purpose of acquiring the frequency deviation data D(n) by the frequency deviation data generator 40. The deviation data D(n) is typically obtained at every predetermined interval such as ten seconds by averaging (moving average) a predetermined number of measured data from the time interval measuring circuit 12. The deviation data D(n) is stored in the curve-fit compensation data generator 120 of the present invention.

A curve D in FIG. 11 shows a plot of frequency deviation in the VCXO during the normal state in which the reference signal is available for the PLL circuit. The curve D shows a long term trend of the frequency changes in the VCXO while the curve D also includes short term fluctuations or noise. Such short term fluctuations are indicative of the phase noise caused by the transmission condition of the satellite wave, intentional interferences embedded in the satellite wave, or white noise in the various components of the standard frequency and timing generator. For the purpose of generating the compensation data, such short term fluctuations must be removed.

Based on the deviation data D(n) shown by the curve D of FIG. 11 and stored in the curve-fit compensation data generator 120, the Wavelet transform process is carried out in specified levels of reconstruction. It is assumed that the frequency deviation data D(n) is generated by every ten seconds from the data generator 40 and such deviation data for about 48 hours (17,280 points) are compiled in the compensation data generator 120. In this situation, the number of data to be used for the Wavelet transform is in the order of $2^{14}$, or 16,384 words which represents the data in the period designated by K in FIG. 11. To formulate the compensation data, it is important to utilize the most recent frequency deviation data.

The curve F in FIG. 11 shows a result of the Wavelet transform when the low pass filter function of level 2 is applied to the original curve D. The curve G in FIG. 11 shows a result of the Wavelet transform when the low pass filter function of level 4 is applied. Further, the curve H in FIG. 11 shows a result of the Wavelet transform when the low pass filter function of level 6 is applied to the original curve D. Thus, it is known in the above that the curve H is appropriate to determine the frequency variations versus time passage in the VCXO 10 because the short term noise components are sufficiently removed.

Based on the past trend of frequency change found by the curve H, for example, the curve-fit compensation data C(h) is produced in the following three ways. In the first approach, the past trend curve 91 is used in the same manner as the compensation curve 92 of FIG. 11. In this method, the curve 91 is transferred to the signal adder 50 as the compensation data C(h). In the second approach, the curve obtained by extending the curve 91 is used as the curve in the compensation data C(h). In the third approach, the curve obtained by extending the curve 91 is used to estimate the curve in the compensation data C(h).

The frequency changes in voltage controlled crystal oscillators (VCXO) show a variety of different curves such as shown in FIG. 12. The curve 201 is an example in which the frequency deviation tends to converge relative to time while the curve 203 is an example in which the frequency deviation tends to diverge. The curve 202 is almost linear. The curve 204 shows periodic changes in the frequency deviation. In response to the types of frequency variations mentioned above, the curve-fit compensation data generator 120 produces the compensation data such as shown by the shaded portion in FIG. 12 to be used during the period defined by B and C.

In the foregoing example, the inverse Harr Wavelet transform achieves different degrees of low pass filter function to determine the long term frequency change in the voltage controlled crystal oscillator. Other types of Wavelet transform or FFT (Fast Fourier transform) process can also be feasible to produce data sequence which can exhibit corresponding low pass filter functions. In the above noted example, the deviation data D(n) is acquired for the period of about 48 hours. It is apparent that the time period for acquiring the deviation data can be shorter than that, such as 5–10 hours to conveniently enjoy the advantages of the present invention.

Figure 13:
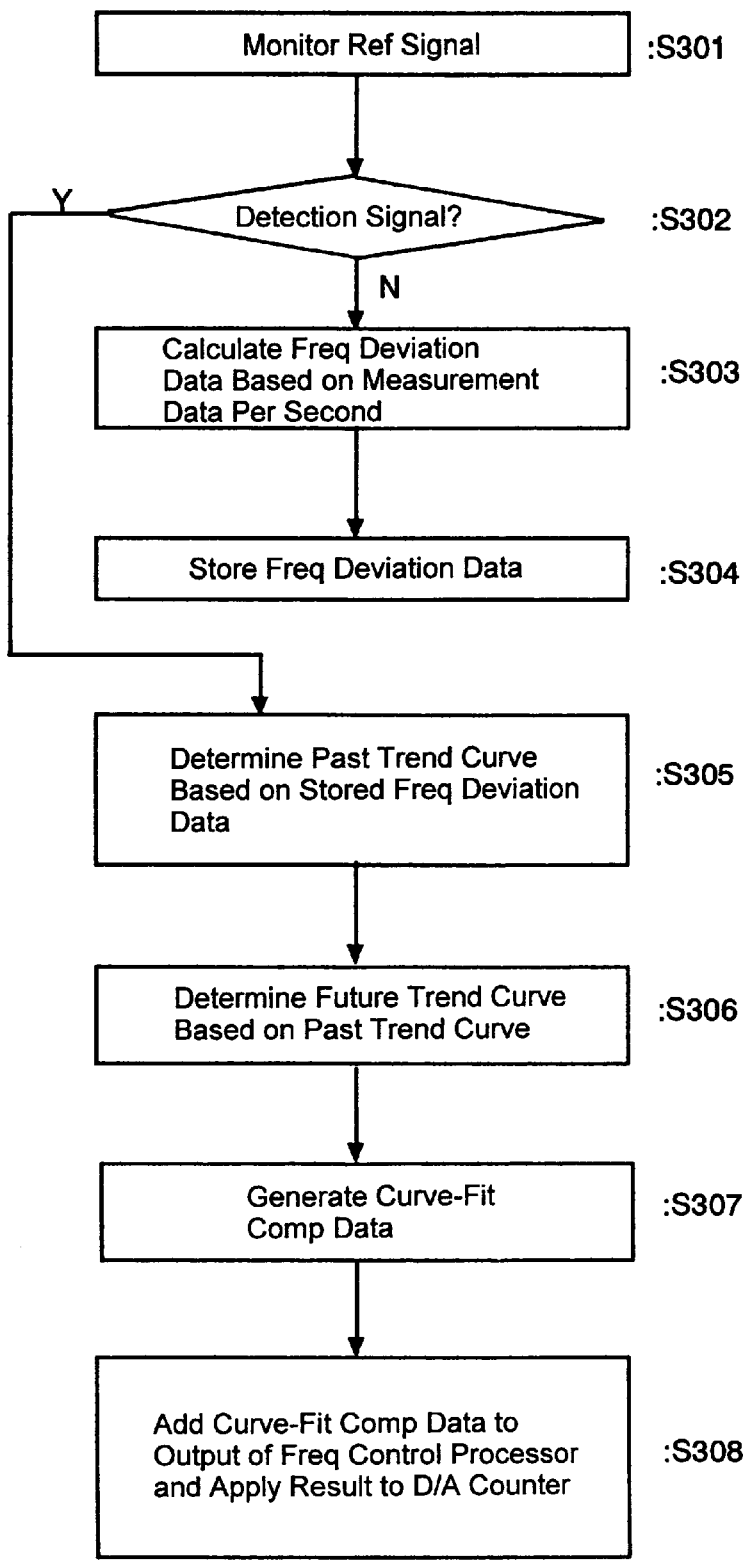
FIG. 13 is a flow chart showing an operational process of the standard frequency and timing generator of the present invention.

FIG. 13 is a flow chart showing an operational process of the standard frequency and timing generator of the present invention. The structure of the standard frequency and timing generator of the present invention is shown in FIGS. 1, 7 and 8. As described in the foregoing, the frequency standard and timing generator includes the satellite wave receiver 11, reference signal detector 110, switches 31 and 32, time interval measuring circuit 12, frequency control processor 23, voltage controlled crystal oscillator (VCXO) 10, D/A (digital to analog) converter 14, signal adder 50, frequency deviation data generator 40, and frequency compensation data generator 45 or 120. FIG. 13 summarizes the operational steps in the present invention.

In the step S301, the reference signal detector 110 determines whether the reference signal is still received from the artificial satellite. If unavailability of the reference signal is not detected in the step S302, the process moves to the step S303 wherein the frequency deviation data is generated based on the measured data received at every second from the time interval measuring circuit 12. The averaged frequency deviation data for a relatively long time period such as 48 hours is consecutively stored in the memory in the step S304.

If the unavailability of the reference signal is detected in the step S302, the process moves to the step S305 wherein the past trend of frequency variations in the VCXO is determined based on the accumulated frequency deviation data. In determining the past trend curve of the frequency deviation, the mathematical process such as the Wavelet transform or FFT may be used. In the next step S306, a future trend curve is determined based on the past trend curve obtained in the step S305.

In the step S307, the curve-fit compensation data is generated based on the future trend curve by the compensation data generator 120. The foregoing steps S305–307 can be simplified if the frequency deviation versus time is approximated to be linear. In the step S308, the compensation data is added to the output signal of the frequency control processor and is supplied to the D/A converter 14. The analog output voltage of the D/A converter 14 controls the oscillation frequency of the VCXO.

As in the foregoing, according to the standard frequency and timing generator of the present invention, the free running frequency of the VCXO 10 is controlled to be substantially equal to the phase locked oscillation frequency even when the satellite time signal is not available. The free running frequency of the VCXO can be compensated even when the frequency changes versus time passage in the VCXO shows a nonlinear curve. The present invention is applicable not only when the reference signal is received from the satellite but also when the reference signal is included in communication signals from a broadcast network system or a communication network system.

Parallel System

FIGS. 14–17 and 19–21 show a further embodiment of the present invention in which the standard frequency and timing generator is configured in a parallel form. In a service system involving a large number of subscribers such a mobile communication system, the system must be continuously operated without fault for a very long time such as ten years or more. To continuously generate a standard frequency signal with high accuracy for many years for such communication systems, a parallel system is used in which two or more standard frequency and timing generators are provided. When there is a problem in one standard generator, such a defective standard generator will be immediately replaced with another standard generator to maintain the system operation.

Figure 14:
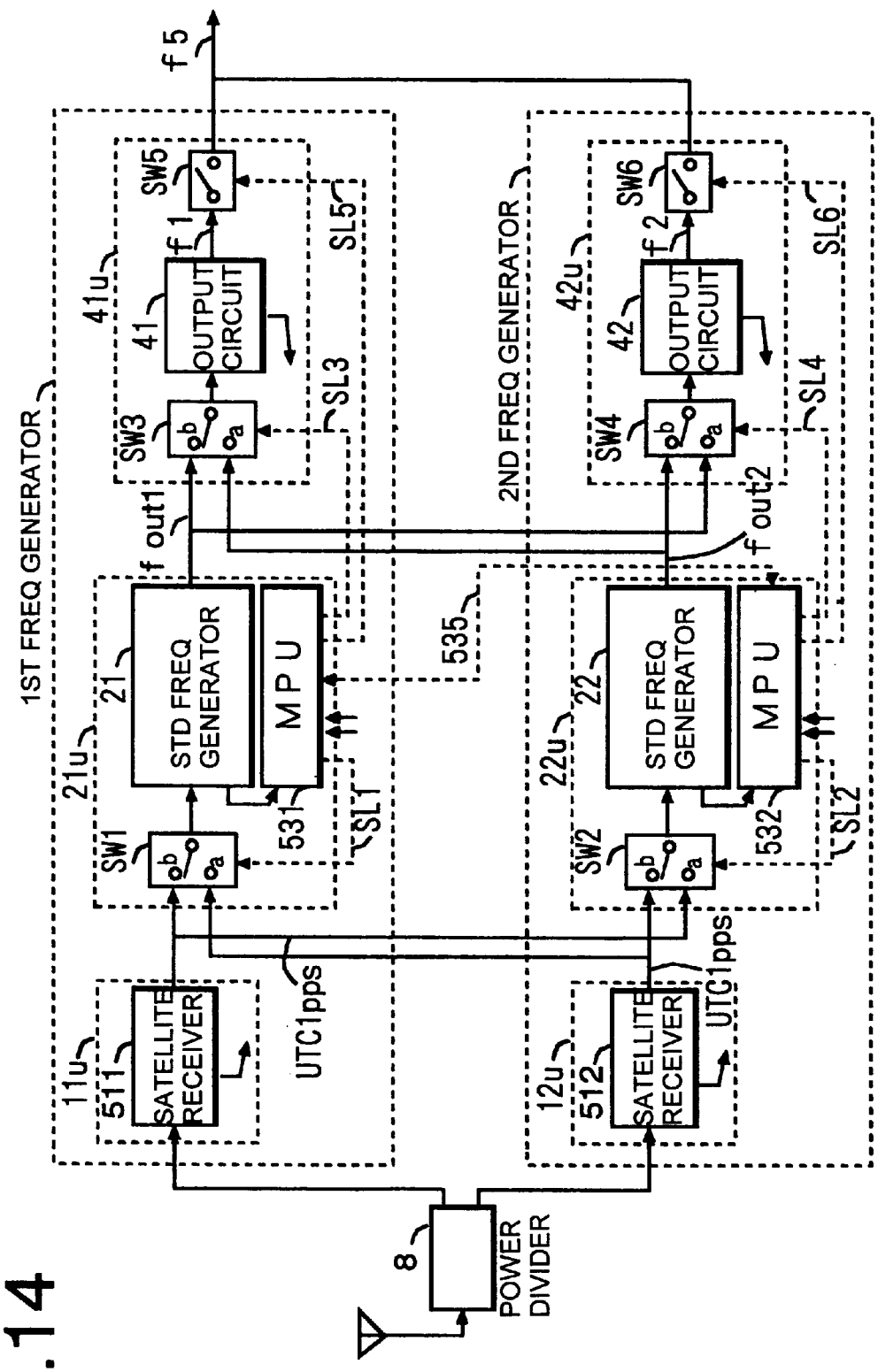
FIG. 14 is a block diagram showing an example of structure of a standard frequency and timing generator employing a parallel system of the present invention.

The parallel system of the present invention further improves a long time reliability by being able to replace one function unit with another rather than a standard generator as a whole. An example of parallel system in the present invention having two standard frequency and timing generators is shown in FIG. 14. The parallel system of FIG. 14 is formed of an antenna, a power divider 8, a first frequency generator and a second frequency generator. The first and second frequency generators 21 and 22 have an identical configuration.

The first frequency generator 21 is basically separated into three function units, a receiver unit 11$u$ having a satellite wave receiver 511, a standard frequency generator unit 21$u$ having a switch SW1, a standard frequency generator 21 and a microprocessor 531, an output unit 41$u$ having a switch SW3, an output circuit 41 and an output switch SW5. Similarly, the second frequency generator 22 is basically separated into three function units, a receiver unit 12$u$ having a satellite wave receiver 512, a standard frequency generator unit 22$u$ having a switch SW2, a standard frequency generator 22 and a microprocessor 532, an output unit 42$u$ having a switch SW4, an output circuit 42 and an output switch SW6.

The power divider 8 provides a satellite radio signal from the antenna to the first and second frequency generators. As noted above, a satellite, such as a GPS (Global Positioning System) satellite radiates an ultra-high accuracy clock signal. Such a clock signal is called a GPS time signal or UTC (Coordinated Universal Time) signal. The GPS time signal is detected by the satellite wave receivers 511 and 522 in the receiver units 11$u$ and 12$u$, respectively. The GPS time signal is used as reference signals for controlling the oscillation frequency of the standard frequency generators 21 and 22 (voltage controlled crystal oscillator VCXO) in the frequency generator units 21$u$ and 22$u$ by the phase lock loop (PLL) operation. Either one of the standard frequency signals is output from the output unit 41$u$ or 42$u$ through the output circuits 41 or 42. The output circuits 41 and 42 are typically formed of frequency converters for converting the frequency to values suitable to a particular application.

Each of the microprocessors 531 and 532 functions as a digital signal processor in the phase lock operation as well as a controller for monitoring and controlling the overall operation of the parallel system. A communication line 535 is provided to exchange information between the microprocessors 531 and 532 regarding, for example, the allocation of operations of the units. The microprocessors 531 and 532 receive various detection signals and data from each unit and determine whether the particular unit should be replaced with the counterpart unit in the system. In the following, it is assumed that, at the initial stage of operation, all the units in the first frequency generator are contributed to the actual output standard frequency signal.

Examples of detection signals from the satellite receiver units 11$u$ and 12$u$ to the microprocessors include signals generated by (1) detection of any abnormal power level in the received satellite signal or demodulated signal, (2) consecutive receipt of abnormal navigation data more than a predetermined number of times, (3) abnormal changes in the GPS time signal (UTC reference signal), and (4) absence of the GPS signal (UTC reference signal).

In the first example, the detection of abnormal power level in the received satellite signal is made by estimating the input power level based on a correlative power level after an inverse spread spectrum process. In the case of GPS receiver, a receiving power level of −137 dBm or lower is determined to be abnormal before lock-in, and a receiving power level of −143 dBm or lower is determined to be abnormal after lock-in.

In the second example, a detection signal is generated when abnormal navigation data (such as numerical number outside of the particular system) is received more than a predetermined number of times, such as ten times. In the third example, a detection signal is generated when the UTC reference signal shows an abnormal repetition rate, such as outside of one second plus and minus 0.1 millisecond. In the fourth example, a detection signal is generated when the UTC reference signal (GPS time signal) is absent in the received satellite wave or in the demodulated signal.

When receiving such detection signals and data, the microprocessors 531 and 532 determine whether the satellite unit 11$u$ should be replaced with the satellite unit 12$u$ by changing the switch SW1. If it is so determined, the microprocessor 531 sends a control signal to the switch SW1 to transmit the GPS time signal from the satellite receiver unit 12$u$ to the standard frequency generator 21.

The standard frequency generator unit 21$u$ sends various detection signals to the microprocessor 531. Examples of detection signals from the standard frequency generator unit 21$u$ include signals generated when (1) measured data from the time interval measuring circuit exceeds an outer limit thereof more than a predetermined number of times, (2) frequency control data to be supplied to the D/A converter exceeds a predetermined range, (3) the time period of the output frequency $f_{out}$ shows abnormal deviations from a predetermined range, and (4) any failures in the memory (RAM) in the microprocessor 531.

In the first example, a detection signal is generated when the measured data from the time interval measuring circuit 12 which compares the phases between the GPS time signal $GPS_{1pps}$ and the crystal time signal $VCXO_{1pps}$ from the VCXO 10 is outside the predetermined range. Such an example is shown in FIG. 15B wherein certain numbers of consecutive data designated by Q are outside the predetermined range W.

In the second example, a detection signal is generated when frequency control data to be supplied to the VCXO via the D/A converter 14 exceeds the predetermined range. For example, if an corresponding analog voltage exceeds the control voltage range of the VCXO 10, a detection signal will be provided to the microprocessor 5311. In the third example, a detection signal is generated when a clock pulse is missing in the train of output standard frequency signal as shown in FIG. 15C. In the fourth example, a detection signal is generated when any fault is found when diagnosing the read/write data in RAM and the program in ROM (3) by the microprocessor 531.

When receiving such detection signals and data, the microprocessors 531 and 532 determine whether the standard frequency generator unit 21 should be replaced with the standard frequency generation unit 22*u* by changing the switch SW3. If it is so determined, the microprocessor 531 sends a control signal to the switch SW3 to transmit the standard frequency signal from the standard frequency generator unit 22*u* to the output unit 41*u*.

Similarly, the output unit 41*u* sends various detection signals to the microprocessor 531. Examples of detection signals from the output unit 41*u* include signals generated when (1) the phase lock loop (PLL) circuit in the frequency converter is out of lock (lock-off), (2) an output signal from the frequency converter is absent, and (3) the time period of the output frequency $f_1$ of the frequency converter shows abnormal deviations from a predetermined range.

In the first example, a detection signal is generated when the lock-off state lasts for a period longer than a predetermined time. This situation arises when the frequency converter in the output unit includes a PLL circuit which is not able to lock-in the loop. In the second example, a detection signal is generated when a clock pulse is missing in the output signal of the frequency converter as shown in FIG. 15C. In the third example, a detection signal is generated when the time period measured on the output frequency $f_1$ of the frequency converter shows abnormal deviations from a predetermined range such as shown by $\Delta T$ in FIG. 15A.

When receiving such detection signals and data, the microprocessors 531 and 532 determine whether the output unit 41 should be replaced with the output unit 42*u* by changing the switches SW5 and SW6. If it is so determined, the microprocessors 531 and 532 send control signals to the switches SW5 and SW6 respectively, to transmit the standard frequency signal from the output unit 42*u* to an outside system such as a mobile communication system.

As in the foregoing, if it is determined that the satellite receiver unit 11*u* is defective, the microprocessor 531 controls a selection signal SL1 to change the switch SW1 to transmit the GPS time signal from the satellite receiver unit 12*u* to the standard frequency generator 21. Thus, both the first and second standard frequency generators 21 and 22 and all other units in the later stage are in the normal operation. The defective unit can be repaired without affecting the operation of the overall system.

If it is determined that the standard frequency generator unit 21 is defective, microprocessor 531 controls a selection signal SL3 to change switch SW3 to transmit the standard frequency signal from the standard frequency generator unit 22*u* to the output unit 41*u*. Since the output frequency signal $f_1$ (or $f_5$) is supplied from the same output unit 41*u*, there is no transitional fluctuations in the frequency or phase, waveform deformation, distortion, or missing edges in the output signal.

If it is determined that the output unit 41 is defective, the microprocessors 531 and 532 send selection signals SL5 and SL6 to the switches SW5 and SW6, respectively, to transmit the standard frequency signal from the output unit 42*u* to the outside system. In this situation, the phases in the frequency signal $f_1$ of the output unit 41*u* and in the frequency signal $f_2$ in the output unit 42*u* are not necessarily matched with one another.

To minimize the phase difference between the standard frequency signals from the output units 41*u* and 42*u*, a circuit arrangement such as shown in FIG. 19A is preferable for the output units 41*u* and 42*u*. In this example, the output switch SW5 is configured by a variable phase circuit 5*a*, a tri-state buffer 5*b* (switch circuit) and a matching resistor 5*c* (variable attenuator). In this arrangement, the phase difference between the standard frequency signals from the output units 41*u* and 42*u* is canceled by adjusting the variable phase circuit 5*a* as shown in FIG. 19B. Thus, when switching the standard frequency signal $f_5$ from the output unit 41*u* to that of the output unit 42*u*, there is no fluctuation or distortion in the waveform.

As noted above, the output circuits 41 and 42 include frequency converters to convert the oscillation frequency of the VCXO to frequencies appropriate to particular applications. Typically, such a frequency converter circuit is a frequency synthesizer having a phase lock loop (PLL) circuit or a frequency multiplier circuit or both. When the frequency range is relatively low, a direct digital synthesizer (DDS) may be sufficient to form the frequency converter.

According to the parallel system of the present invention, overall reliability of the system is substantially improved as described in the following with reference to FIG. 16. As is known in the art, reliability $R(t)$ of a system formed of N items is expressed:

$$R(t)=S(t)/N=\{N-F(t)\}/N$$

where the number of defective items is $F(t)$ after the time t, or the number of remaining items is $S(t)=N-F(t)$.

Thus, when the reliability is given by $R(t)=0.7$ for a certain system, it means that the probability of no failure after the time t is 70% in the subject system. Based on this relationship, the reliability R3 in the conventional model of FIG. 18 is compared with the reliability NR4 of the present invention of FIG. 14.

Figure 18:
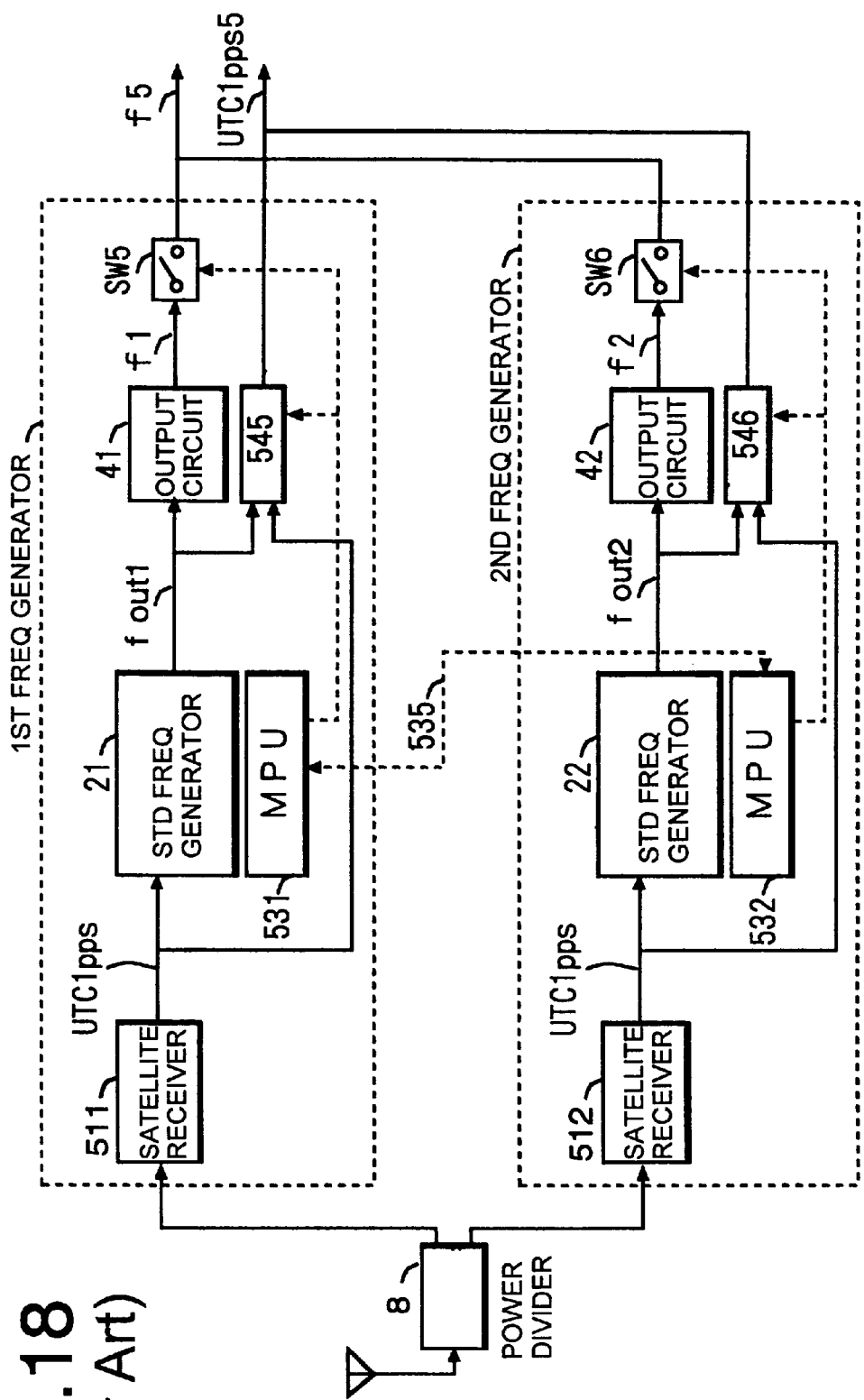
FIG. 18 is a block diagram showing a structure of a conventional standard frequency and timing generator employing a parallel system.

The reliability R3 of the conventional parallel system of FIG. 18 is:

$$R3=131\ \{(1-A\times B\times C\times S)\times(1-A\times B\times C\times S)\}$$

where A represents the satellite wave receivers 511 and 512, B represents the standard frequency generators 21 and 22, C represents the output circuits 41 and 42, and S represents the switches SW5 and SW6 in FIG. 18.

The reliability NR4 of the parallel system of the present invention of FIG. 14 is:

$$NR4=\{1-(1-A)\times(1-A)\}\times[1-\{1-(Sa\times B)\}\times\{1-(Sa\times B)\}]\times[1-\{1-(Sb\times C\times Sc)\}\times\{1-(Sb\times C\times Sc)\}]$$

where A represents the satellite wave receivers 511 and 512, B represents the standard frequency generators 21 and 22, C represents the output circuits 41 and 42, and Sa represents the switches SW1 and SW2 of FIG. 14, Sb represents the switches SW3 and SW4 of FIG. 14, and Sc represents the switches SW5 and SW6 of FIG. 14.

By applying specific numbers in the equations for five samples of parallel systems, reliability data showing the difference between the conventional technology and the present invention is listed in FIG. 16. For example, in the sample 1, the reliability NR4 of the present invention is calculated to be NR4=0.6381 as shown in the lower part of FIG. 16. In contrast, the reliability R3 in the sample 1 of the conventional structure is R3=0.5221 as shown in the upper part of FIG. 16. The other samples 2–5 also show the similar difference in the reliability. Thus, as shown at the bottom part of FIG. 16, the overall reliability is improved by about 11–18% in the present invention.

In the above explanation, although the number of switches are increased in the present invention, such an increase in the number of switches does not affect the overall reliability of the system. This is because a switch itself is a very simple component compared with other units in the system each of which has a large number of components therein. Thus, increase in the number of switches is negligible in the determination of the overall reliability of the parallel system.

Figure 17:
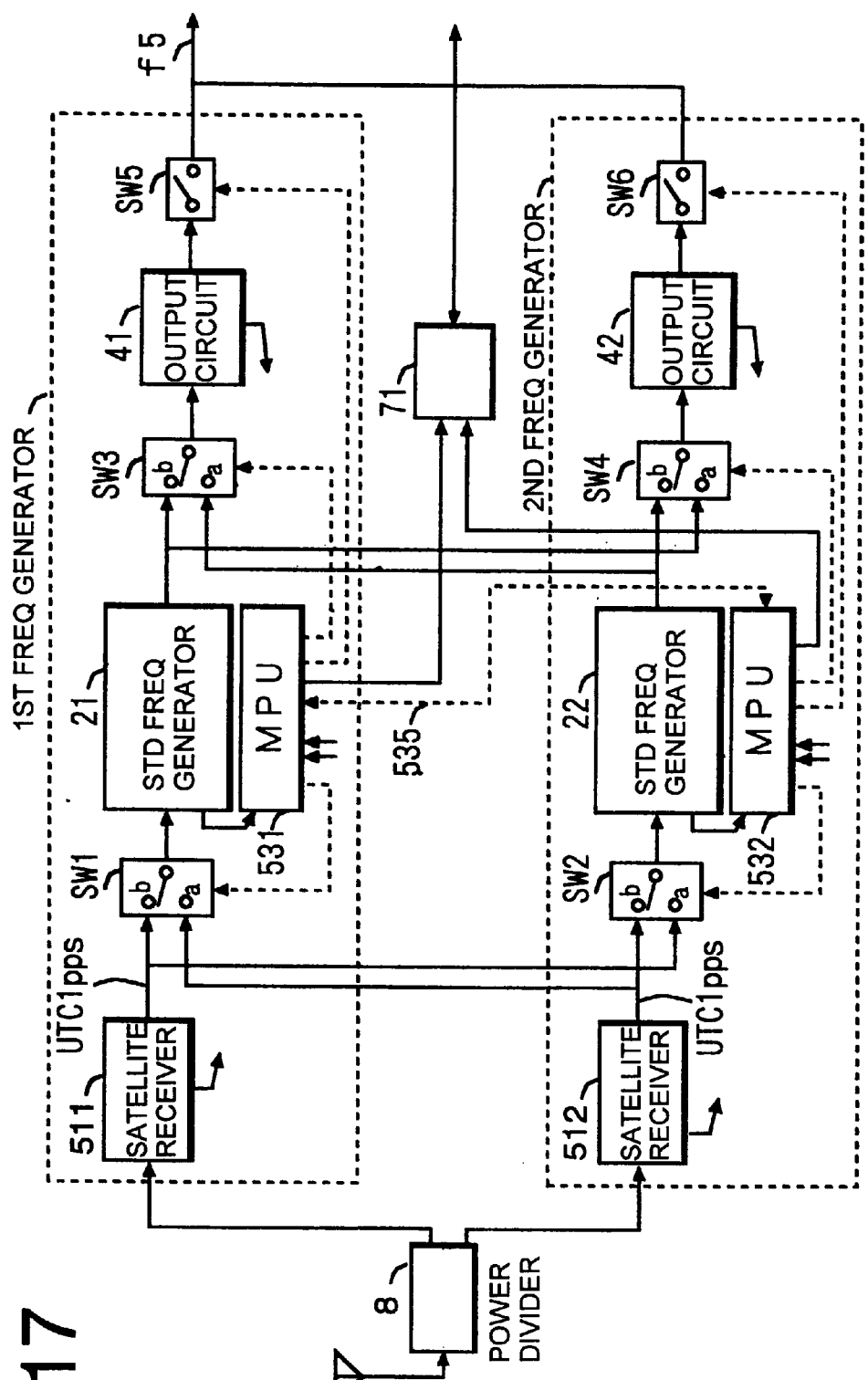
FIG. 17 is a block diagram showing another example of structure of a standard frequency and timing generator employing a parallel system of the present invention.

FIG. 17 shows a modified structure of the parallel system of the present invention wherein a communication means 71 is provided therein. The communication means 71 is connected to the microprocessors 531 and 532. When any defects are discovered in the parallel system, the communication means 71 can send a signal announcing such problems in the system to an external system. The external system can judge whether any special countermeasure should be taken. In the case where the parallel system is located in a remote area, the maintenance plan can effectively be made based on such information from the communication means 71. Examples of the communication means 71 include a telephone line with a modem, a hierarchy type communication net work, a local area network (LAN), and an RS232C line.

Figure 20:
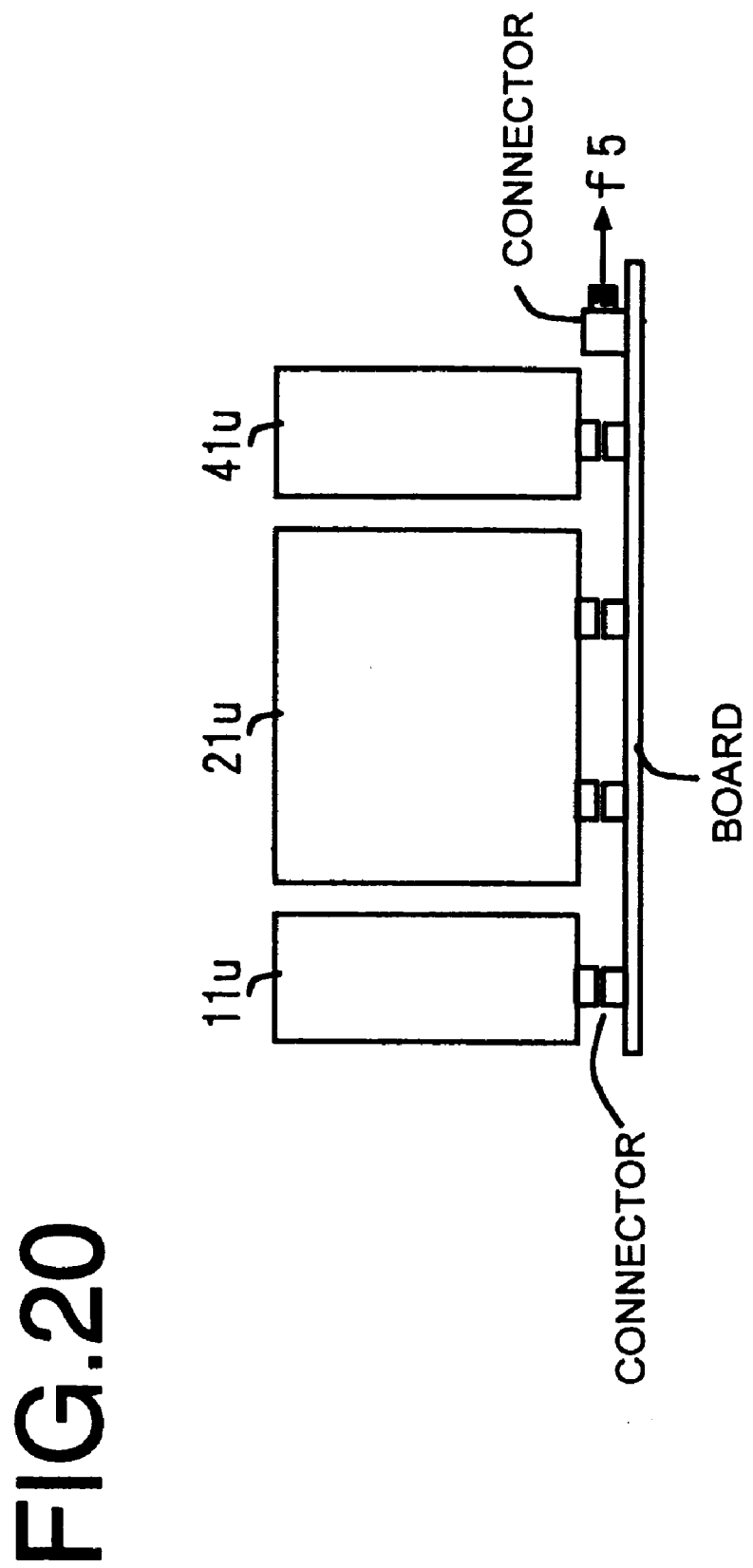
FIG. 20 is a schematic diagram showing a mechanical structure in the standard frequency and timing generator employing the parallel system of the present invention in which each block is exchangeable through a connector.

In the parallel system such as shown in FIGS. 14 and 17, the function units in the system are preferably structured so that maintenance and replacement works can be carried out easily. For example, as shown in FIG. 20, each function unit is attached to a mother board through a connector so that it is easily connected or disconnected from the parallel system. Such connectors are preferably hot-line type connectors so that the replacement of the function unit can be made without turning off the power of the system.

Figure 21:
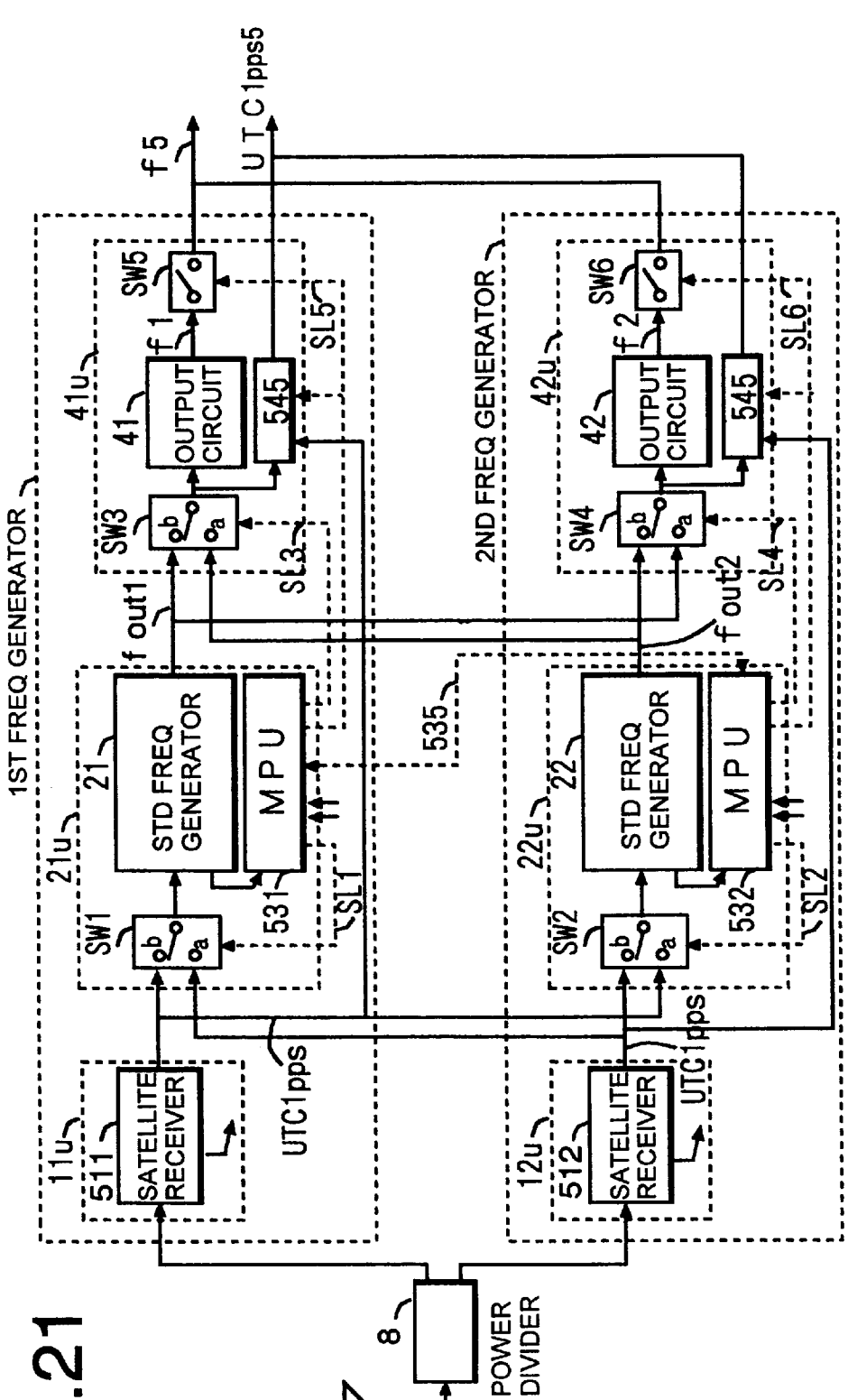
FIG. 21 is a block diagram showing further example of structure of a standard frequency and timing generator employing a parallel system of the present invention.

Further, although not shown, it may be preferable to provide means for averaging the frequency difference between the first and second frequency generators. Further, as shown in FIG. 21, reference timing generators 545 may preferably be provided in the first and second standard frequency generators. The reference timing generators 545 provide a timing signal of one second interval which is synchronized with the $UTC_{1pps}$ reference signal from the satellite wave receiver to an external system via a switch circuit such as a tri-state driver. In the case where the $UTC_{1pps}$ is not available from the satellite wave receiver, the timing signal formed by compensating the free running frequency of the VCXO in the standard frequency generator is alternatively provided to the external system.

According to the present invention, the standard frequency and timing generator is capable of generating a high accuracy standard frequency and timing signal even when the ultra-high accuracy time signal such as GPS time signal is unavailable for phase locking the voltage controlled crystal oscillator. The standard frequency and timing generator of the present invention utilizes the voltage controlled quartz-crystal oscillator which is controlled to be phase locked to the GPS time signal. During the phase lock state, the present invention compiles frequency deviation data of the crystal oscillator and provides compensation data produced based on the frequency deviation data to the crystal oscillator during an abnormal operation period where the reference time signal is unavailable to regulate the oscillation frequency of the crystal oscillator.

The frequency standard and timing generator of the present invention is capable of maintaining the high accuracy of the frequency and timing generated therefrom without using a high stability crystal oscillator when an external reference signal is unavailable for a long period of time. In the frequency standard and timing generator of the present invention, the compensation data is produced by a mathematical process applied to the data showing the past trend of frequency deviation in the crystal oscillator used therein. An example of such mathematical process is a Wavelet transform process applied to the past trend data.

According to the present invention, the frequency standard generator using a parallel system is capable of improving an overall reliability thereof by replacing a defective block in one generator with the corresponding block in the other generator. The parallel system can switch from one function unit to a counterpart function unit when any defects are found in the function unit without affecting other performances of the standard frequency generator. Further, the parallel system of the present invention is capable of switching from one function unit to a counterpart function unit without causing any penalties in performance, such as fluctuations in the frequency or phase of the output standard frequency signal.

Although only preferred embodiments are specifically illustrated and described herein, it will be appreciated that many modifications and variations of the present invention are possible in light of the above teachings and within the purview of the appended claims without departing the spirit and intended scope of the invention.

What is claimed is:

1. A standard frequency and timing generator for generating a high accuracy standard frequency signal and a timing signal, comprising:

a voltage controlled crystal oscillator (VCXO) for generating high stability output signal to be used as a standard frequency and timing signal;

a radio wave receiver which receives a radio wave which includes a high accuracy reference time signal and reproduces said time signal to be used as a reference for said VCXO;

a time interval measuring circuit which measures a time interval which is a phase difference between said reference time signal and said output signal of said VCXO and generates data indicating said phase difference;

a frequency control processor which arithmetically determines control data based on said phase difference data from said time interval measuring circuit such that said phase difference maintains a constant value by a phase lock loop;

a frequency deviation data generator for averaging and compiling said phase difference data with a predetermined sequence to obtain frequency deviation trend data of said VCXO;

a compensation data generator for generating compensation data based on said frequency deviation trend data to compensate frequency changes in said VCXO when said reference time signal is unavailable for said phase lock loop;

a reference signal detector for generating a detection signal when said reference time signal is unavailable from said radio wave receiver for said phase lock loop; and a D/A converter which converts said control data from said frequency control processor and said compensation data from said compensation data generator to an analog voltage to be provided to said VCXO.

2. A frequency standard generator as defined in claim 1, further comprising a frequency divider which divides said output signal of said VCXO by a dividing ratio arranged to generate a crystal time signal which is identical in frequency to said reference time signal.

3. A frequency standard generator as defined in claim 1, further comprising a signal adder which receives said control data from said frequency control processor and said compensation data from said compensation data generator and provides a sum of said data to said D/A converter.

4. A frequency standard generator as defined in claim 1, further comprising a temperature sensor for sensing a temperature change in said VCXO and providing a temperature sense signal representing said temperature change to said frequency control processor.

5. A frequency standard generator as defined in claim 1, wherein said VCXO is provided with a temperature oven for maintaining a constant temperature in said VCXO.

6. A frequency standard generator as defined in claim 1, wherein said frequency control processor dynamically determines parameters for said phase lock loop including a loop bandwidth of said phase lock loop based on said phase difference measured by said time interval measuring circuit.

7. A frequency standard generator as defined in claim 1, further comprising a switch for connecting an output of said compensation data generator when said detection signal is generated by said reference signal detector.

8. A frequency standard generator as defined in claim 1, wherein said frequency deviation data generator applies a moving average process for predetermined number of phase difference data received from said time interval measuring circuit.

9. A frequency standard generator as defined in claim 1, wherein said compensation data generator generates said compensation data which indicates a voltage value which changes in a linear fashion with passage of time to control the oscillation frequency of said VCXO.

10. A frequency standard generator as defined in claim 1, wherein said compensation data generator generates said compensation data which indicates a voltage value which changes in a curve fashion with passage of time to control the oscillation frequency of said VCXO.

11. A frequency standard generator as defined in claim 1, further includes a frequency converter which receives said output signal of said VCXO and converts its frequency to meet the requirement of an external system.

12. A frequency standard generator as defined in claim 1, wherein said radio wave receiver is a satellite radio wave receiver which detects said reference time signal from said satellite radio wave, wherein said reference time signal is produced based on an atomic-resonance frequency standard.

13. A frequency standard generator as defined in claim 1, wherein said radio wave is generated by a Global Positioning System (GPS) satellite.

14. A frequency standard generator as defined in claim 1, wherein said radio wave receiver is a national frequency standard wave receiver which detects said reference time signal from national frequency standard wave.

15. A frequency standard generator as defined in claim 1, wherein said radio wave receiver is a communication signal receiver which detects said reference time signal from said communication signal in a communication network or a broadcast network.

16. A standard frequency and timing generator for generating a high accuracy standard frequency signal and a timing signal, comprising:

a voltage controlled crystal oscillator (VCXO) for generating a high stability oscillation frequency to be used as a standard frequency and timing signal;

a radio wave receiver which receives a radio wave which includes a high accuracy reference time signal and reproduces said reference time signal to be used as a reference to a phase lock loop for phase locking said oscillation frequency of said VCXO;

a time interval measuring circuit which measures a time interval which is a phase difference between said reference time signal and a time signal derived from said oscillation frequency of said VCXO and generates data indicating said phase difference;

a frequency control processor which arithmetically determines control data based on said phase difference data from said time interval measuring circuit such that said phase difference maintains a constant value by a phase lock loop;

a frequency deviation data generator for averaging and compiling said phase difference data with a predetermined sequence to obtain frequency deviation trend data of said VCXO;

a curve-fit compensation data generator for generating compensation data based on said frequency deviation trend data from said frequency deviation data generator by applying a Wavelet transform process to compensate curve like frequency changes in a free running oscillation state of said VCXO when said reference time signal is unavailable for said phase lock loop;

a reference signal detector for generating a detection signal when said reference time signal is unavailable from said radio wave receiver for said phase lock loop; and a D/A converter which converts said control data from said frequency control processor and said compensation data from said compensation data generator to an analog voltage to be provided to said VCXO.

17. A frequency standard generator as defined in claim 16, further comprising a frequency divider which divides said output signal of said VCXO by a dividing ratio arranged to generate said time signal which is identical in frequency to said reference time signal.

18. A frequency standard generator as defined in claim 16, further comprising a signal adder which receives said control data from said frequency control processor and said compensation data from said compensation data generator and provides a sum of said data to said D/A converter.

19. A frequency standard generator as defined in claim 16, wherein said curve-fit compensation data generator applies an appropriate degree of low pass filter function derived from said Wavelet transform process to said frequency deviation trend data to determine a past trend curve of said frequency changes in said VCXO to produce said curve-fit compensation data to compensate a future trend curve of frequency changes in said VCXO.

20. A frequency standard generator as defined in claim 19, wherein different degrees of said low pass filter function by said Wavelet transform process are derived by segmenting said frequency deviation trend data from said frequency deviation data generator to a plurality of levels each of said levels includes at least a pair of detail data $H_\alpha(\beta)$ and smooth data $L_\beta(\alpha)$, and changing the values of said detail data $H_\alpha(\beta)$ in selected levels to zero in an inverse Wavelet transform process.

21. A frequency standard generator as defined in claim 19, wherein different degrees of said low pass filter function by said Wavelet transform process are derived by segmenting said frequency deviation trend data from said frequency deviation data generator to a plurality of levels each of said levels includes at least a pair of detail data $H_\alpha(\beta)$ and smooth data $L_\beta(\alpha)$, and changing the values of said detail data $H_\alpha(\beta)$ in selected levels to an average value of a plurality of said detail data in an inverse Wavelet transform process.

22. A frequency standard generator as defined in claim 16, wherein said compensation data generator generates said curve-fit compensation data based on sufficient amount of said frequency deviation data showing a most recent frequency derivation trend of said VCXO.

23. A frequency standard generator as defined in claim 16, further comprising a temperature sensor for sensing a temperature change in said VCXO and providing a temperature sense signal representing said temperature change to said frequency control processor.

24. A frequency standard generator as defined in claim 16, wherein said VCXO is provided with a temperature oven for maintaining a constant temperature in said VCXO.

25. A frequency standard generator as defined in claim 16, wherein said frequency control processor dynamically determines parameters for said phase lock loop including a loop bandwidth of said phase lock loop based on said phase difference measured by said time interval measuring circuit.

26. A frequency standard generator as defined in claim 16, further comprising a switch for connecting an output of said compensation data generator when said detection signal is generated by said reference signal detector.

27. A frequency standard generator as defined in claim 16, wherein said frequency deviation data generator applies a moving average process for predetermined number of phase difference data received from said time interval measuring circuit.

28. A frequency standard generator as defined in claim 16, wherein said compensation data generator generates said compensation data which indicates a voltage value which changes in a linear fashion with passage of time to control the oscillation frequency of said VCXO.

29. A frequency standard generator as defined in claim 16, wherein said compensation data generator generates said compensation data which indicates a voltage value which changes in a curve fashion with passage of time to control the oscillation frequency of said VCXO.

30. A frequency standard generator as defined in claim 16, further includes a frequency converter which receives said output signal of said VCXO and converts its frequency to meet the requirement of an external system.

31. A frequency standard generator as defined in claim 16, wherein said radio wave receiver is a satellite radio wave receiver which detects said reference time signal from said satellite radio wave, wherein said reference time signal is produced based on an atomic-resonance frequency standard.

32. A frequency standard generator as defined in claim 16, wherein said radio wave is generated by a Global Positioning System (GPS) satellite.

33. A frequency standard generator as defined in claim 16, wherein said radio wave receiver is a national frequency standard wave receiver which detects said reference time signal from national frequency standard wave.

34. A frequency standard generator as defined in claim 16, wherein said radio wave receiver is a communication signal receiver which detects said reference time signal from said communication signal in a communication network or a broadcast network.

35. A method of generating a high accuracy standard frequency signal and a timing signal, comprising the following steps of:

providing a voltage controlled crystal oscillator (VCXO) for generating a high stability oscillation frequency to be used as a standard frequency and timing signal;

receiving a radio wave which includes a high accuracy reference time signal and reproducing said reference time signal;

detecting a phase difference between said reference time signal and a time signal derived from said oscillation frequency of said VCXO and generating data indicating said phase difference;

forming a phase lock loop for phase locking said oscillation frequency of said VCXO to said reference time signal by sending a control data based on said phase difference data;

collecting said phase difference data with a predetermined sequence to obtain frequency deviation trend data of said VCXO;

generating curve-fit compensation data based on said frequency deviation trend data by applying a Wavelet transform process to compensate frequency changes in a free running oscillation state of said VCXO when said reference time signal is unavailable for said phase lock loop;

generating a detection signal when said reference time signal is unavailable from said radio wave for said phase lock loop; and converting said compensation data to an analog voltage and applying said analog voltage to said VCXO when said reference time signal is unavailable.

36. A method of generating a high accuracy reference frequency signal and a timing signal as defined in claim 35, wherein said step of generating said curve-fit compensation data includes a process of applying an appropriate degree of low pass filter function derived from said Wavelet transform process to said frequency deviation trend data to determine a past trend curve of said frequency changes in said VCXO to produce said curve-fit compensation data to compensate a future trend curve of frequency changes in said VCXO.

37. A method of generating a high accuracy reference frequency signal and a timing signal as defined in claim 36, wherein said step of applying said low pass function includes a process of segmenting said frequency deviation trend data to a plurality of levels each of said levels includes at least a pair of detail data $H_\alpha(\beta)$ and smooth data $L_\beta(\alpha)$, and changing the values of said detail data $H_\alpha(\beta)$ in selected levels to zero in an inverse Wavelet transform process.

38. A method of generating a high accuracy reference frequency signal and a timing signal as defined in claim 36, wherein said step of applying said low pass function includes a process of segmenting said frequency deviation trend data to a plurality of levels each of said levels includes at least a pair of detail data $H_\alpha(\beta)$ and smooth data $L_\beta(\alpha)$, and changing the values of said detail data $H_\alpha(\beta)$ in selected levels to an average value of a plurality of said detail data in an inverse Wavelet transform process.

39. A method of generating a high accuracy reference frequency signal and a timing signal as defined in claim 35, wherein said analog voltage is produced by a D/A converter having the minimum and maximum data of $A_{min}$ and $A_{max}$, respectively, and said VCXO has the minimum and maximum oscillation frequency of $F_{min}$ and $F_{max}$, respectively, and wherein said compensation data A(i) to be applied to said D/A converter is produced based on:

$$A(i)=\{D(L)/R\}+A_{min}$$

where D(L) is frequency deviation data immediately before starting said free running state of the VCXO, R is frequency resolution per one digit of the D/A converter and is derived from $R=(F_{min}-F_{max})/A_{max}-A_{min})$.

40. A standard frequency and timing generator for generating a high accuracy standard frequency and timing signal, comprising:
    (a) a first frequency and timing generator comprising:
        a first receiver unit having a first satellite wave receiver for extracting a reference time signal from a radio wave signal;
        a first standard frequency generator unit having a first standard frequency generator;
        a first output unit having a first output circuit;
    (b) a second frequency and timing generator comprising:
        a second receiver unit having a second satellite wave receiver for extracting said reference time signal from said radio wave signal;
        a second standard frequency generator unit having a second standard frequency generator;
        a second output unit having a second output circuit;
    (c) a power divider for receiving said radio wave signal and distributing said radio wave signal to said first and second receiver units;
    (d) an output terminal for providing a standard frequency and timing signal to an external system therefrom;
    (e) switch means for selecting one of two counterpart units to send a signal from the selected unit to the units of later stages.
    (e) a controller for receiving defect detection signals from each of said units and sending a control signal to said switch means to establish signal flows in said units toward said output terminal.

41. A standard frequency and timing generator as defined in claim 40, wherein each of said units is mounted on a board of said generator through a connector, thereby easily connecting and disconnecting from said board.

42. A standard frequency and timing generator as defined in claim 40, wherein each of said units is mounted on a board of said generator through a hot-line type connector so that the replacement of the unit is made without turning off a power of said generator.

43. A standard frequency and timing generator as defined in claim 40, further comprising a communication means for sending information regarding operational conditions of said standard frequency and timing generator to an outside system of said generator.

44. A standard frequency and timing generator as defined in claim 40, each of said first and second output circuits includes a frequency converter which receives an output signal of standard frequency generator and converts its frequency to a predetermined value.

45. A standard frequency and timing generator as defined in claim 40, at least one of said first and second output units includes a variable phase circuit to cancel a phase difference between the standard frequency signals from the first and second output units.

46. A standard frequency and timing generator for generating a high accuracy standard frequency and timing signal, comprising:
    (a) a first frequency and timing generator comprising:
        a first receiver unit having a first satellite wave receiver for extracting a reference time signal from a radio wave signal;
        a first standard frequency generator unit having a first standard frequency generator and a first input switch;
        a first output unit having a first intermediate switch, a first output circuit, and a first output switch;
    (b) a second frequency and timing generator comprising:
        a second receiver unit having a second satellite wave receiver for extracting said reference time signal from said radio wave signal;
        a second standard frequency generator unit having a second standard frequency generator and a second input switch;
        a second output unit having a second intermediate switch, a second output circuit, and a second output switch;
    (c) a power divider for receiving said radio wave signal and distributing said radio wave signal to said first and second receiver units;
    (d) an output terminal for providing a standard frequency and timing signal to an external system therefrom; and
    (e) a controller for receiving defect detection signals from each of said units and sending a control signal to said switches to select signal flows in said units toward said output terminal;
    wherein said first and second input switches select either one of signals from said first and second receiver units, and said first and second intermediate switches select either one of signals from said first and second standard frequency generator units, and said first and second output switches select either one of signals from said first and second output circuits.

* * * * *